United States Patent [19]
Zablotny et al.

[11] Patent Number: 5,922,168
[45] Date of Patent: Jul. 13, 1999

[54] APPARATUS FOR MAKING LAMINATED ELECTRICAL AND ELECTRONIC DEVICES

[75] Inventors: Gordon O. Zablotny, Escondido; James W. Horner, Oceanside, both of Calif.

[73] Assignee: Pacific Trinetics Corporation, Carlsbad, Calif.

[21] Appl. No.: 08/725,425

[22] Filed: Oct. 3, 1996

Related U.S. Application Data

[63] Continuation-in-part of application No. 08/535,622, Sep. 28, 1995, Pat. No. 5,772,838.

[51] Int. Cl.$^6$ .................................................. B32B 31/00
[52] U.S. Cl. ..................... 156/379; 156/361; 156/512; 156/516; 156/517; 156/519; 29/38.9; 29/561; 29/563; 29/564; 29/707; 29/711; 29/791; 29/281.5
[58] Field of Search ................................ 156/351, 353, 156/361, 379, 384, 510, 512, 516, 517, 519, 530, 538, 539, 542, 543, 549; 29/411, 38.9, 428, 429, 527.1, 561, 563, 564, 564.1, 566.1, 707, 711, 791, 819, 281.5, 284

[56] References Cited

U.S. PATENT DOCUMENTS 4,757,759  7/1988  Wallace ..................................... 101/35

FOREIGN PATENT DOCUMENTS

| 0511801 A2 | 4/1992 | European Pat. Off. . |
| 0709866 A2 | 1/1996 | European Pat. Off. . |
| 0709866 | 5/1996 | European Pat. Off. . |
| 2746732 | 4/1978 | Germany . |

*Primary Examiner*—Merrick Dixon
*Attorney, Agent, or Firm*—Brown, Martin, Haller & McClain, LLP

[57] ABSTRACT

An apparatus for automatically making a laminated electrical or electronic device has a series of processing stations including an inspection station for inspecting the quality of printing at a series of indexed segments on a ceramic coated, continuous tape, a stack and tack station at which sequential segments of the tape are cut and stacked on top of each other to form a stack having a selected number of layers, a lamination station in which the stacked layers are laminated together, and a cutting station at which the stack is cut into a plurality of individual chips, a tape feed mechanism for indexing the tape segments sequentially through the inspection station and stack and tack station, and a drive mechanism for moving a stack from the stack and tack station through the lamination station and cutting station.

19 Claims, 28 Drawing Sheets

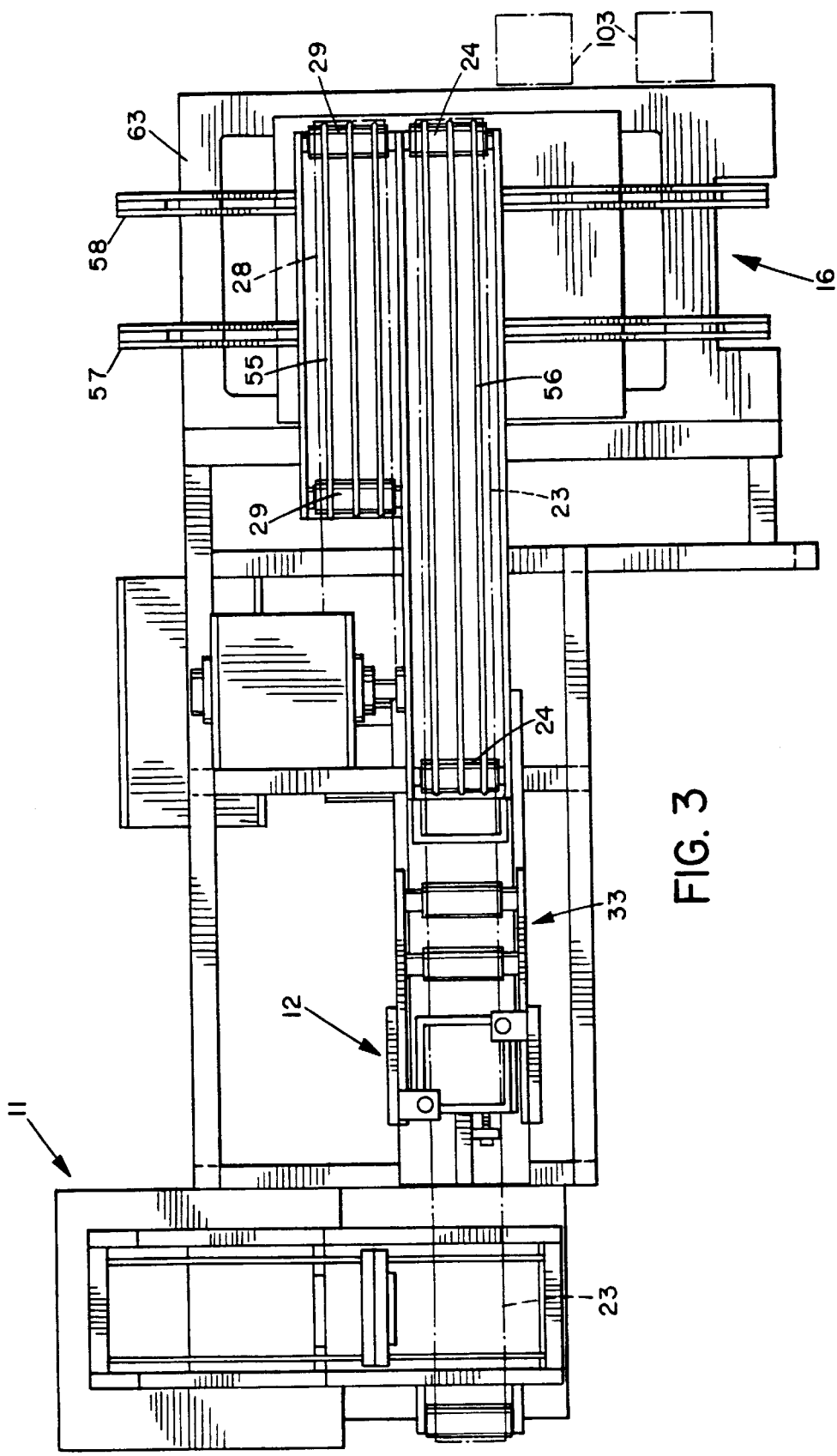

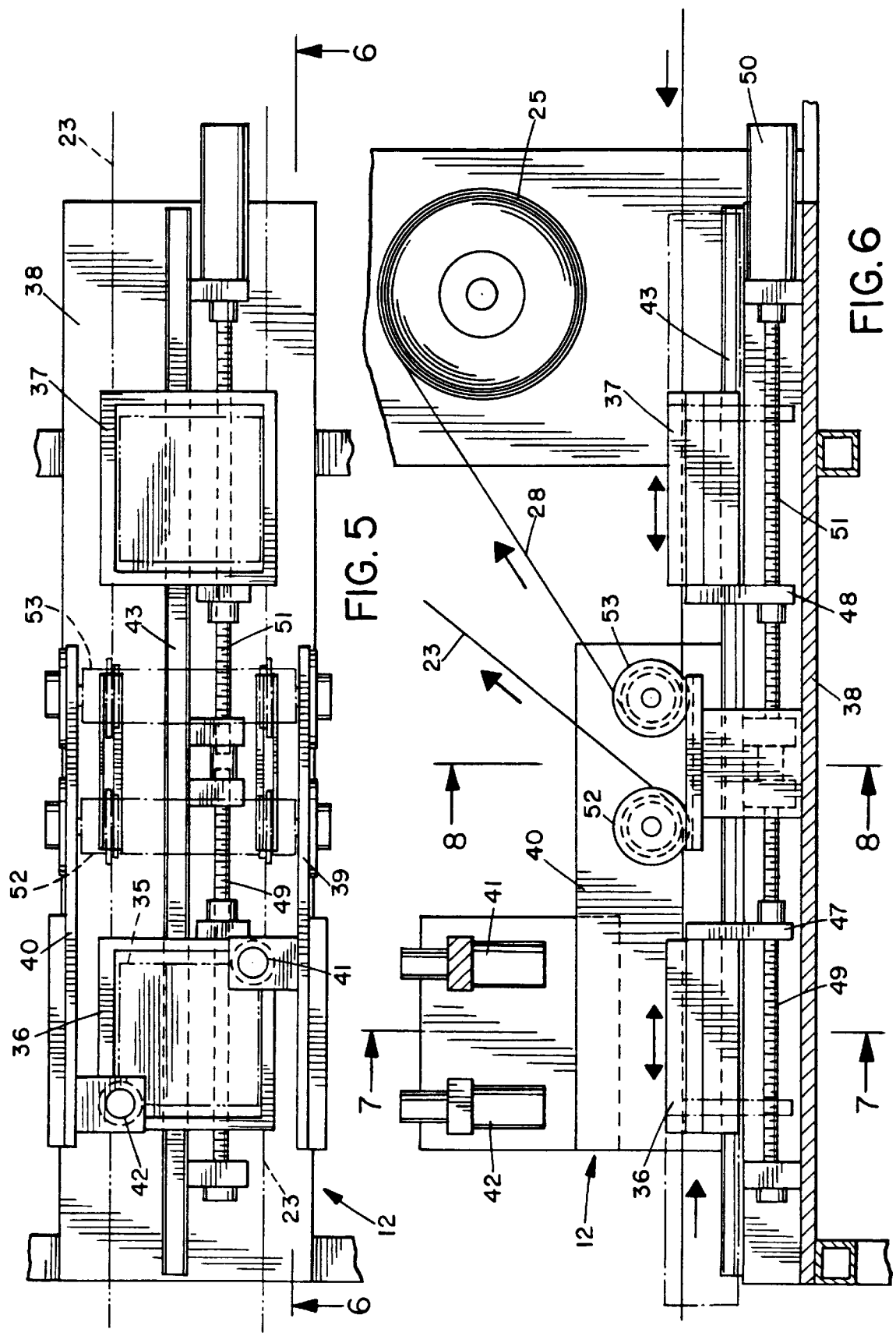

APPARATUS FOR MAKING LAMINATED ELECTRICAL AND ELECTRONIC DEVICES

CROSS-REFERENCES TO RELATED APPLICATIONS

This is a Continuation-In-Part of application Ser. No. 08/535,622 filed Sep. 28, 1995, now U.S. Pat. No. 5,772,838.

BACKGROUND OF THE INVENTION

The present invention relates to the manufacture of multi-layer capacitor or other electrical or electronic component chips.

Many electrical devices such as semiconductor chips, capacitors and the like are formed from multiple individual layers ("patterned substrates") of ceramic substrates on which is imprinted the desired electronic circuitry. The individual leaves are stacked together so that each layer of circuitry is sandwiched between two layers of insulating ceramic. The individual circuitry layers are then joined by electrical connections made either through holes in the ceramic substrates or by connections exterior to the laminated stack. (For brevity, these laminated electrical devices will often hereafter be referred to collectively as "capacitors." It will of course be understood, however, that the invention to be described is applicable to manufacture of all types of laminated electrical devices, not only capacitors. In addition, the patterned substrates and the "cover sheets" will often be referred to herein as "leaves".)

In practice, the individual capacitors are actually manufactured in the form of large wafers which contain dozens or hundreds of individual capacitors printed in a grid fashion. Once all the leaves have been stacked and laminated together, a wafer is sliced vertically so that each of the individual capacitors is separated from the wafer into a single device. Previously it has been common for such wafers to have dimensions of 3"×4" (76×102 mm) or greater, with each of the individual capacitors having dimensions of 0.120"×0.060" (3.0×1.5 mm; designated in the industry as a "1206" capacitor). Thus, a single laminated wafer might contain on the order of 1,000 individual capacitors which are subsequently sliced apart into individual devices.

In past practice, the individual leaves of printed ceramic substrates could be easily aligned and stacked together, since they had relatively large thicknesses, typically 1–3 mils (0.04–0.12 mm), and therefore were substantially rigid and easy to manipulate. However, recently two factors have arisen which have changed the situation dramatically. First, with the prior art thicker leaves, there was a tendency for air pockets to form between the layers caused by the raised printed electronic circuitry. As more leaves were added, the outer surfaces of the laminated stack tended to become irregular or wavy. The more leaves that were added (typically up to 30–50), the greater was the waviness, making registration of subsequent leaves in the manufacturing process that much more difficult.

Second, there has been a trend in the industry to require thinner and smaller laminated devices to increase capacity or conserve space. Much electrical and electronic equipment is designed to use laminated devices of specific external dimensions. Therefore, if the individual leaves can be made thinner, more leaves, and thus more capacity or complexity, can be incorporated into a laminated device while still maintaining the standard external device dimensions. Alternatively, in many cases there is a desire to have reduced external device dimensions, so that more devices can be incorporated into a piece of equipment without increasing the size of the piece of equipment or, with the same components, the piece of equipment itself can be made smaller. This is particularly important where the space in which the equipment is to be used is at a premium, such as in aircraft, spacecraft, satellites, computers, communication equipment and so forth. For instance, capacitor sizes have now been reduced to external dimensions such as 0.080"×0.050" (2.0×1.3 mm; "0805" capacitors) and 0.040×0.020 in. (1.0×0.5 mm: "0402" capacitors), as well as other intermediate sizes. It is still important, however, to be able to obtain the same electrical or electronic capability in the thinner and smaller capacitors.

As these laminated devices have become smaller and thinner, the individual ceramic substrates have also become thinner so that the individual leaves have been much more difficult to bring into registry with the other leaves during manufacture. Tape as thin as 10 microns is now commonly used in manufacture of such components. The problem of registration and alignment has been sufficiently severe that production speeds have been substantially less than optimum so that overall yields of wafers have been reduced. In addition, because of the increasing problems with waviness, yields of the devices themselves have been further reduced by an increase in the numbers of unsatisfactory wafers which must be rejected. Since each wafer contains hundreds of individual devices, the loss of a single wafer represents a substantial reduction in the overall yield of the number of devices. Manual handling of thin wafers has also caused reduction in yields. As the tape (wafers) become even thinner, manual handling will not even be an option.

It would therefore be advantageous to have apparatus which could be used to bring the individual leaves quickly and accurately into registration for stacking. Such apparatus would be particularly desirable for use with thin leaves and where it could be fed by a continuous supply of such leaves substrates, could accurately and quickly align and register the individual leaves and stack them into an overall assembly of properly aligned leaves for subsequent bonding to form the unitary device.

SUMMARY OF THE INVENTION

It is an object of the present invention to provide a new and improved method and apparatus for automatic manufacture of multi-layer capacitor and other chips. By manufacturing such chips in an automated process, operator errors can be substantially eliminated.

According to one aspect of the present invention, an apparatus for making a laminated electrical or electronic device is provided, which comprises a series of processing stations including an inspection station for inspecting the quality of printing at a series of indexed segments on a ceramic coated, continuous tape, a stack and tack station at which sequential segments of the tape are cut and stacked on top of each other to form a stack having a selected number of layers, a lamination station in which the stacked layers are laminated together, and a cutting station at which the stack is cut into a plurality of individual chips, a tape feed mechanism for indexing the tape segments sequentially through the inspection station and stack and tack station, and a drive mechanism for moving a stack from the stack and tack station through the lamination station and cutting station.

Preferably, the apparatus includes a controller for controlling operation of the tape feed mechanism, drive mechanism, and stack and tack station, the controller receiving input from the inspection station so as to skip any tape segments which were detected to have faulty printing. A printing station may be provided as the first station, prior to the inspection station, for applying the desired printed circuitry to the tape in successive frames. Alternatively, pre-printed tape may be used, obviating the need for a printer.

In a preferred embodiment of the invention, the stack and tack station includes a movably mounted stacking head, movable back and forth between a load and unload position, and at least one stacking position in alignment with an indexed tape segment, and movable between a lowered position and a raised position in contact with an indexed tape segment, a cutting device for excising a patterned or unpatterned substrate from the tape segment in the raised position of the stacking head and transferring the substrate to the stacking head, the tape feed mechanism advancing the next sequential tape segment to the stack and tack station after lowering of the stacking head back to the lowered position, whereby repetitive operation of the stacking head and cutting device causes a plurality of patterned or unpatterned substrates to be stacked onto the stacking head. Once the desired number of layers have been built up on the stacking head, the stacking head moves back to the loading and unloading position and the built-up stack is unloaded to the stack transport mechanism for transport to the lamination station.

Preferably, each stack is built upon a metal build plate, and an empty build plate is loaded onto the stacking head in the load and unload position prior to each stack build up procedure. Once a desired number of layers is built up on the build plate, the stacking head moves back to the load and unload position, and the build plate and accumulated stack is unloaded onto the transport mechanism for transport to the lamination station. A new build plate is then loaded onto the stacking head and the stacking head moves back for alignment with the next sequential tape segment.

In a preferred embodiment of the invention, the stacking head is movable in a direction transverse to the tape drive direction between three different positions, including the load and unload position, a first stacking position aligned with a printed tape, and a second stacking position aligned with a segment of a blank, unprinted ceramic tape. Segments of the blank, unprinted tape are excised and unprinted layers are stacked at selected locations in each stack build-up operation, in order to produce interleaves between printed layers according to a selected part height. One or more unprinted layers will also normally be provided to form bottom and top cover layers for the part. The build plate may be pre-loaded with the desired number of bottom cover layers before loading onto the stacking head.

Preferably, the stack and tack station also includes an inspection mechanism for inspecting fiducials on each printed tape segment, and the stacking head is rotatably mounted for controlling the stacking head orientation based on the inspected fiducial position. The stacking head is also movable in transverse x and y directions to align the previously stacked layers with the next printed tape segment. Due to the movably mounted stacking head, the actual print location of the electrode pattern on the ceramic is not critical, but the stacking head can be moved so that the stack is aligned with the printed electrode pattern.

According to another aspect of the present invention, a method of making a laminated electronic or electrical device is provided, which comprises the steps of indexing a tape carrying sequential segments of printed ceramic substrate to an inspection station where each segment is inspected for print quality, indexing the inspected segments sequentially into a stacking position above a stacking head, detecting the position of fiducial marks on each segment, moving the stacking head into a desired orientation relative to the detected fiducial positions, raising the stacking head into contact with the tape segment, excising the substrate segment from the backing onto the stacking head, and repeating the operation for each sequentially indexed tape segment until a selected number of layers have been built up into a stack onto the stacking head, transferring the stack from the stacking head onto a transport mechanism, and transporting the stack to a lamination station for laminating the layers into a unitary laminated pad.

Preferably, a plurality of stacks are accumulated into a cassette before transporting the cassette to the lamination station, and each stack is sequentially unloaded from the cassette into the lamination station. After lamination, each laminated stack is sequentially loaded into a further cassette, which is transported to a cutting station when full. The laminated stacks are sequentially unloaded into a cutting device for cutting each pad into a plurality of individual chips.

This provides a fully automated, computer controllable system which incorporates all the steps necessary to make a multi-layer ceramic capacitor or other electronic or electrical chip from a roll of ceramic tape prior to firing. The automated process, along with the inspection procedures, helps to reduce errors in manufacture of such chips and also substantially reduces the number of operators required.

BRIEF DESCRIPTION OF THE DRAWINGS

A preferred embodiment of the invention will now be described by way of example only, with reference to the accompanying drawings in which like reference numerals refer to like parts, and in which:

FIG. 3 is a top plan view of the structure of FIG. 2;

FIG. 5 is an enlarged top plan view of the inspection and advance stage;

FIG. 6 is a sectional view taken on line 6—6 of FIG. 5;

DESCRIPTION OF THE PREFERRED EMBODIMENT

FIGS. 1–26 schematically illustrate an automated apparatus for making laminated electrical and electronic devices such as laminated capacitor chips according to a preferred embodiment of the present invention. FIGS. 27–33 schematically illustrate the control software for operating the apparatus to automatically produce individual components from printed tape and cover tape, as described in more detail below. The automated apparatus incorporates all of the steps necessary to make a multi-layer ceramic capacitor chip from a roll of ceramic tape to diced chips prior to firing.

Figure 2:
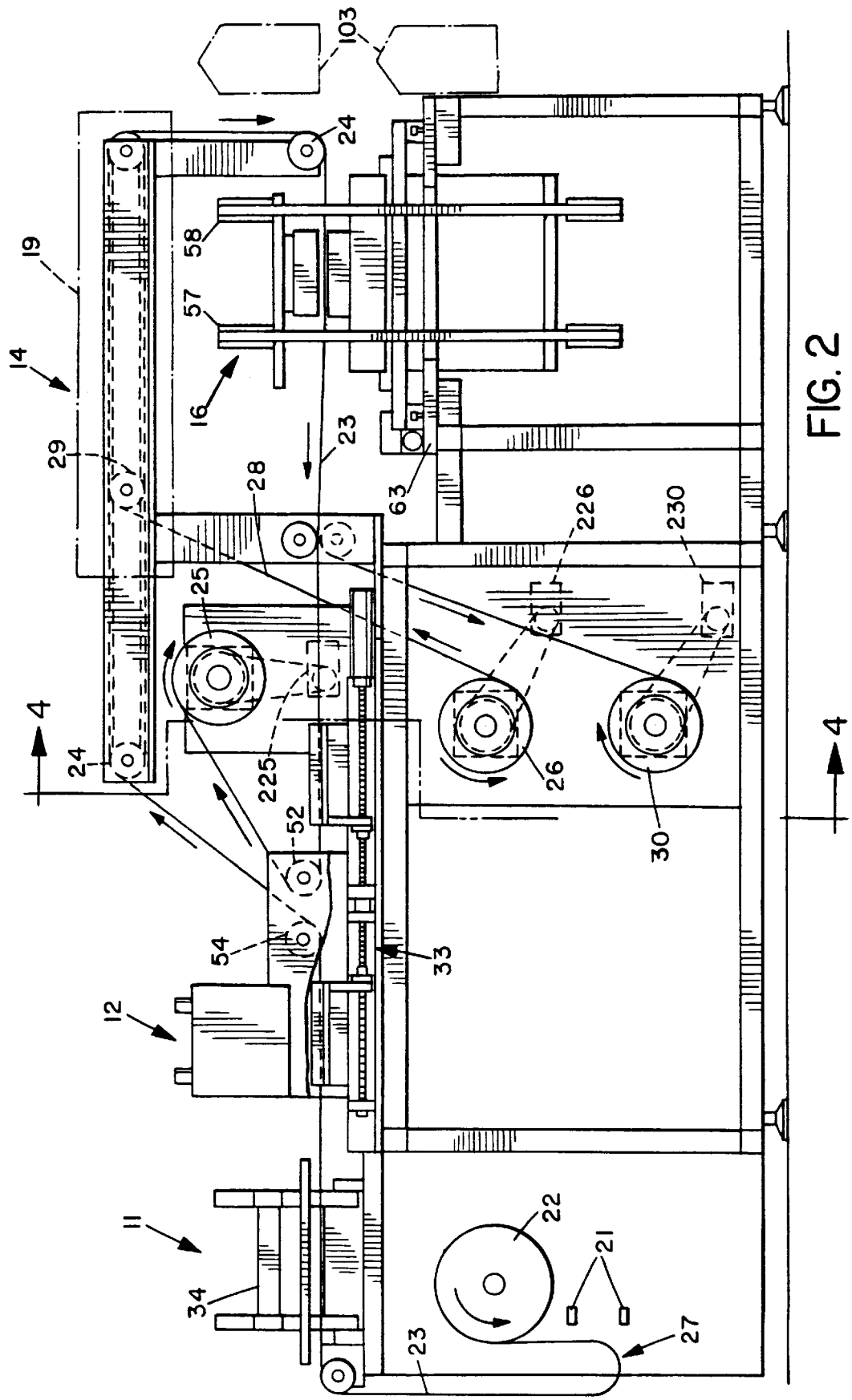
FIG. 2 is a front view of the initial stages of the apparatus.
Figure 4:
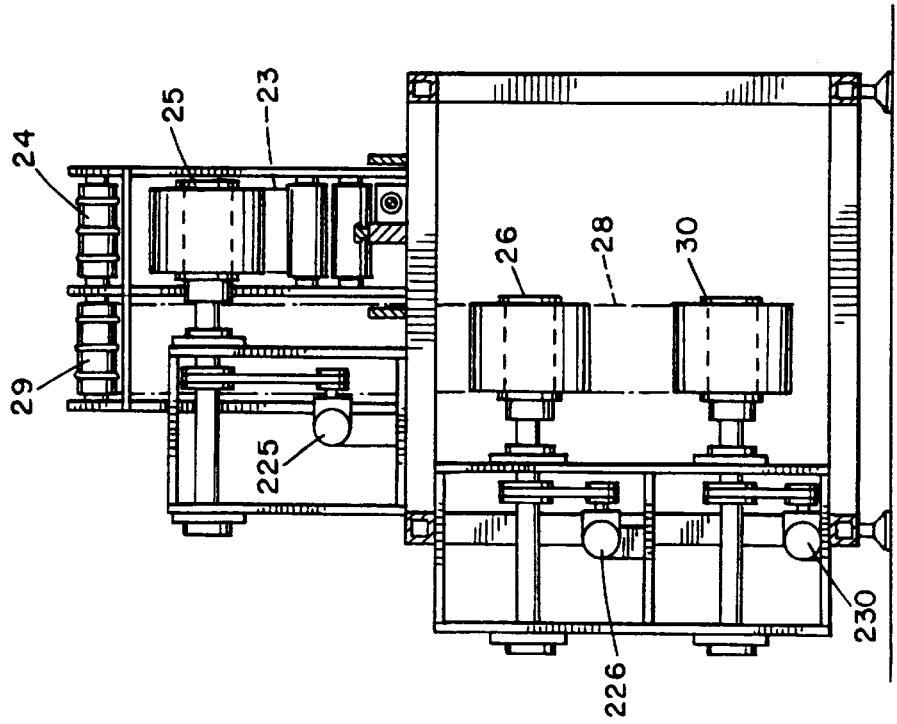
FIG. 4 is a sectional view taken on line 4—4 of FIG. 2.

The apparatus is mounted in a suitable outer housing 10 and includes a series of processing stations, comprising an optional screen printing station 11, a pattern inspection station 12, a print drying station 14, a stack and tack station 16, a lamination station 18, and a cutting station 20. A drying chamber 19 is provided between the stack and tack station 16 and the lamination station 18. A first reel 22 of ceramic tape 23 is rotatably mounted in the housing. The tape 23 comprises a backing tape layer of Mylar or the like carrying a ceramic substrate. The tape 23 is fed over a plurality of guide rollers 24 in a tape path extending through screen printing station 10, inspection station 12, drying station 14, and stack and tack station 16 before being rewound onto a driven rewind roller 25, which is driven by motor 225, as best illustrated in FIGS. 2 and 4. Tape 23 is preferably unwound to leave a free hanging loop 27 at feed roller 22, to reduce the risk of excessive tape tension, which could potentially cause the tape to stretch. Sensors 21 are provided at the tape feed station to detect the loop size and the presence of tape, respectively. The tape sensor provides an output signal to indicate that the machine is out of tape, while the loop sensor determines that a sufficient loop 27 is present.

A second reel 26 of ceramic cover tape 28 is also rotatably mounted in the housing. Cover tape 28 is fed over guide rollers 29 in a predetermined path from feed reel 26, which is driven by motor 226, through the stack and tack station 16, where it extends parallel to the first tape 24, and back onto a driven rewind reel or roller 30, which is driven by motor 230, as best illustrated in FIGS. 2 and 4. A tape present sensor arrangement (not illustrated) may also be provided at the cover tape feed reel 26.

Figure 21:
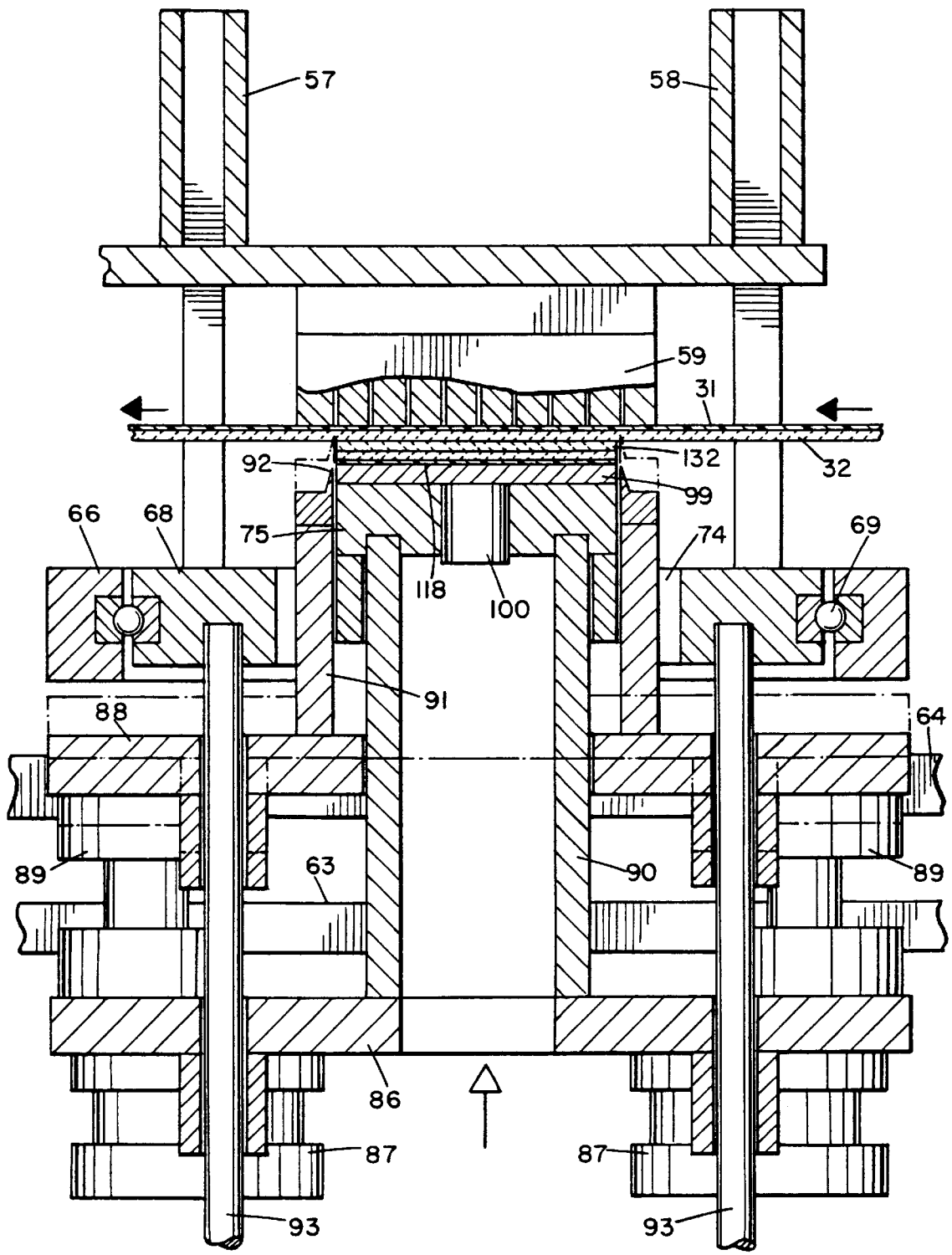
FIG. 21 is an enlargement of a portion of FIG. 12, showing the tacking action.
Figure 22:
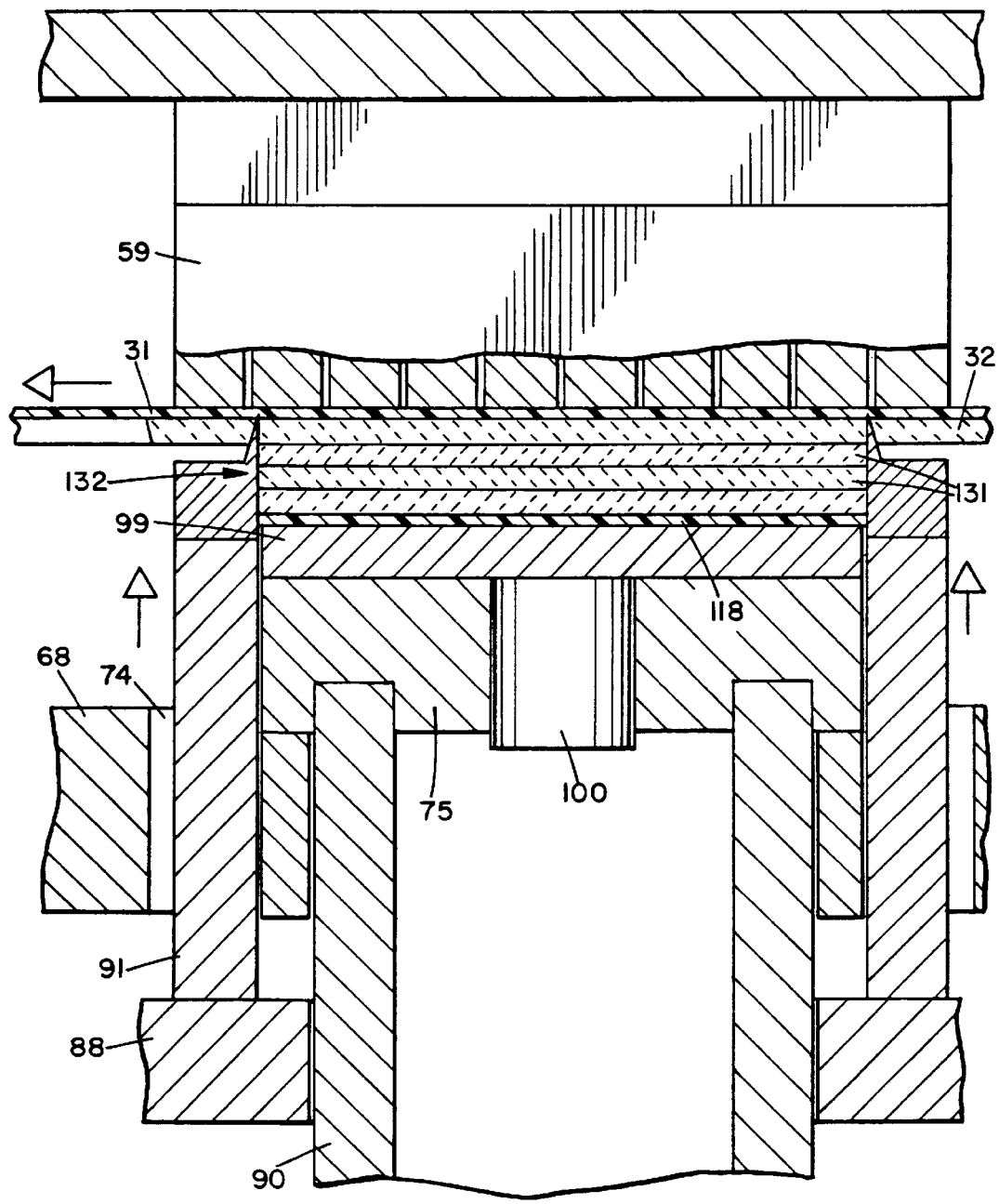
FIG. 22 is a further enlargement of a portion of FIG. 21, showing the cutting action.
Figure 23:
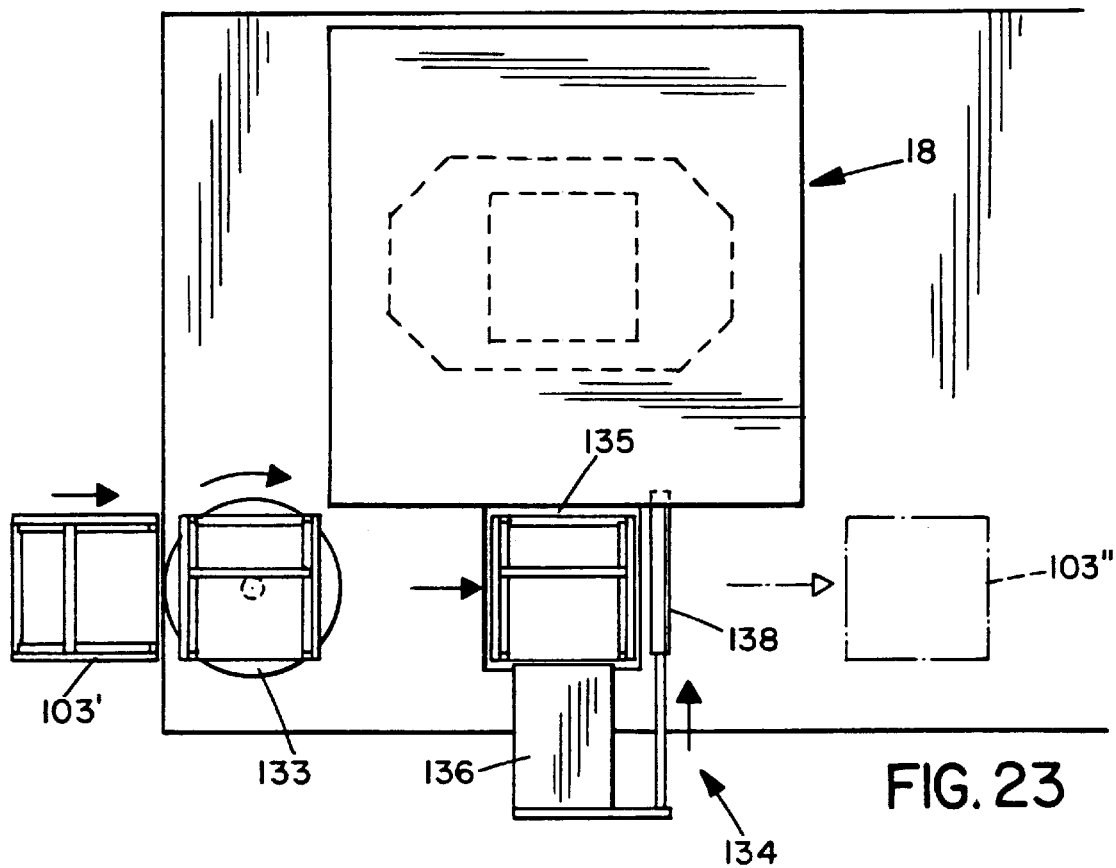
FIG. 23 is a top plan view of the laminating station.
Figure 24:
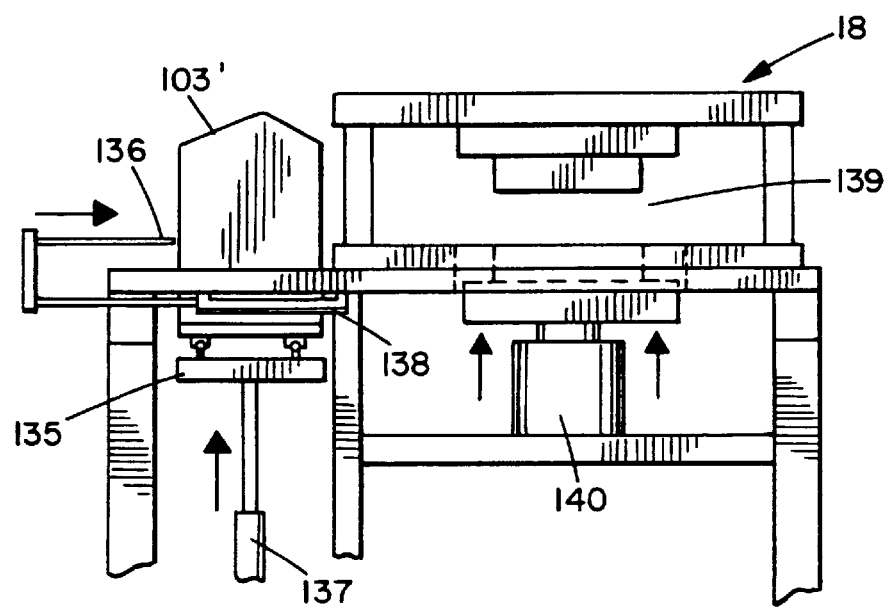
FIG. 24 is a side elevation view of the structure of FIG. 23.
Figure 25:
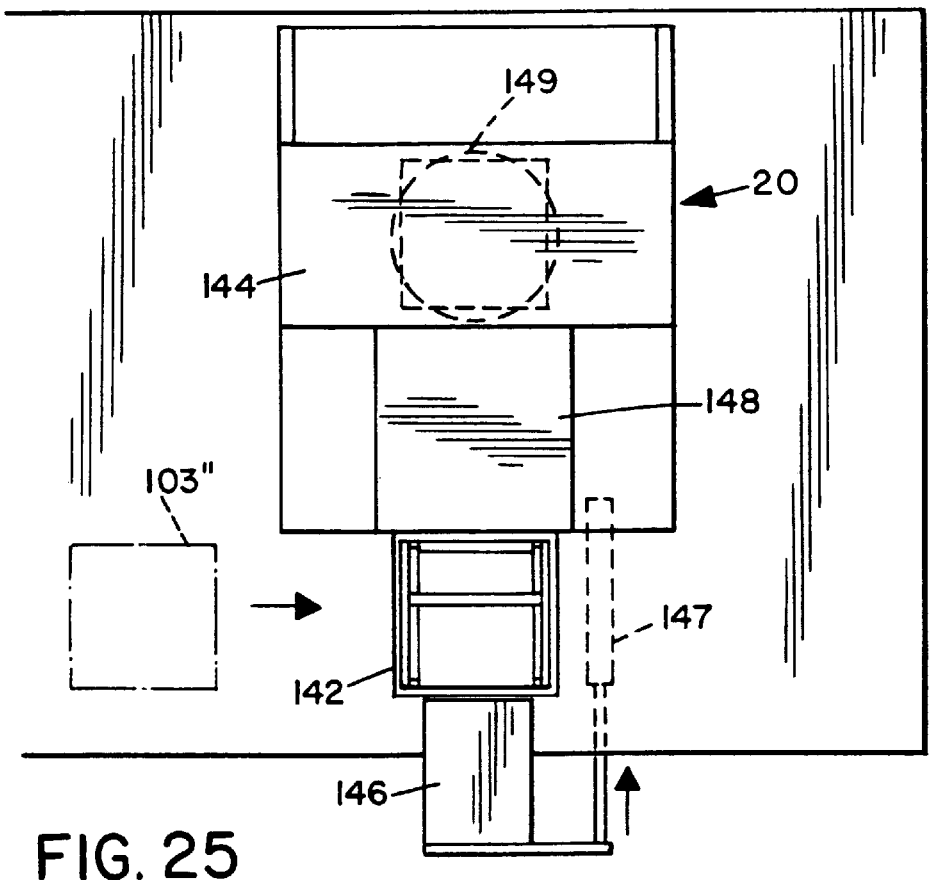
FIG. 25 is a top plan view of the cutting station.
Figure 26:
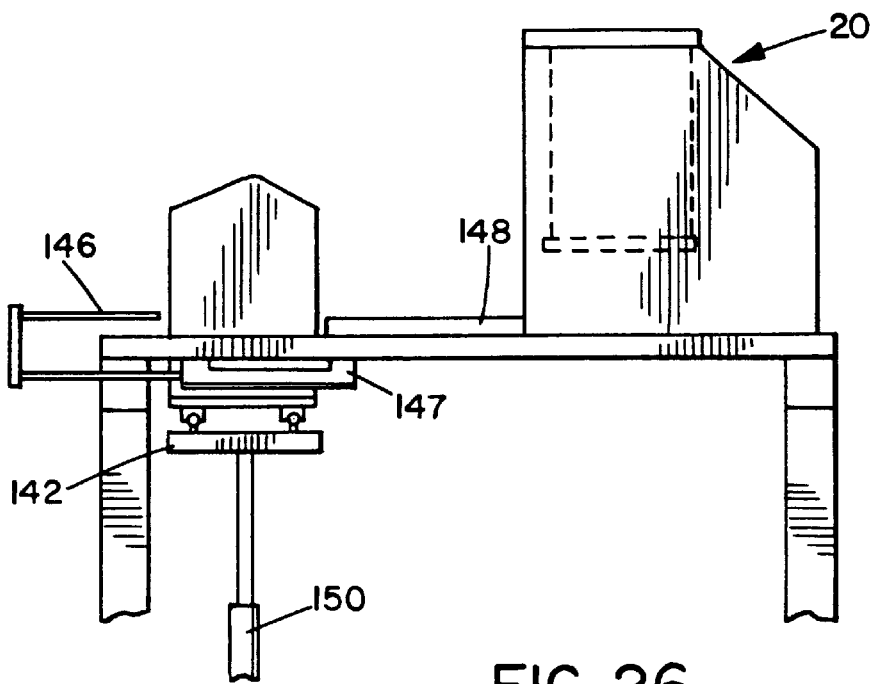
FIG. 26 is a side elevation view of the structure of FIG. 25.

Tape 23,28 has a backing layer 31 of flexible inert material such as polyester of the type commonly available under the trademark MYLAR®. The tape is coated completely on one side with a thin layer 32 of ceramic, as best illustrated in FIGS. 21 and 22. The feeding of both the printed tape and cover tape is such that, at the stack and tack station, the ceramic side will face downwardly as viewed in FIGS. 21 and 22. An indexing mechanism 33 associated with the print inspection station 12 advances the print tape incrementally, frame-by-frame, through the system, as will be explained in more detail below.

As the tape 24 leaves the feed reel or roller 22, it first passes through print station 11 which applies the desired electrical circuitry onto the ceramic face of the tape in successive frames. Alternatively, pre-printed rolls of tape may be used and the print station may be eliminated in this case. The print station preferably utilizes a gantry type, squeegee printer unit 34 to print successive frames 35 of the tape with the circuitry desired for successive layers of a plurality of multi-layer components. Each frame will also be printed with fiducial marks, both for inspecting the print quality at inspection station 12, and for alignment purposes at stack and tack station 16 and cutting station 20.

Figure 7:
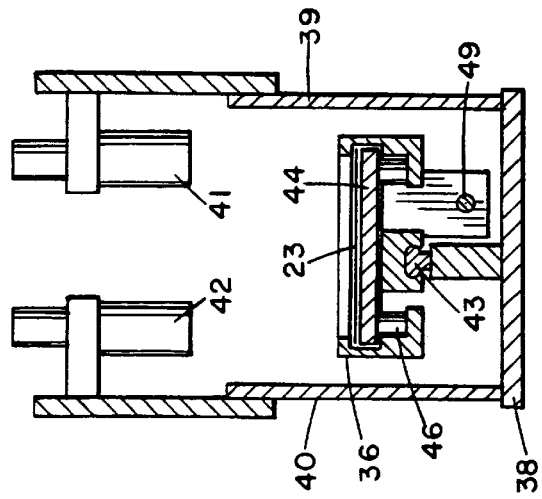
FIG. 7 is a sectional view taken on line 7—7 of FIG. 6.

As each frame is indexed into registry with the inspection station 12, clamping frame 36 of the tape indexing mechanism clamps down onto the tape to hold it in position. The tape indexing mechanism 33 is illustrated in more detail in FIGS. 5–8. The indexing mechanism indexes the printed tape 23 with the first clamping frame 36 holding the printed tape 23 at the inspection station and a second clamping frame 37 holding the printed tape at a location prior to take-up reel 25. The mechanism is supported on a base plate 38 and between two spaced side plates 39,40. Cameras 41,42 for inspecting the fiducial marks on the printed tape at the inspection station are also mounted on the opposite side plates, as illustrated in FIGS. 5, 6 and 7, at positions which correspond to opposite corners of a printed frame 35. The mechanism basically comprises a slide rail 43 on which a first support plate 44 is slidably mounted at the print inspection station, as best illustrated in FIG. 7. A second support plate 45 is slidably mounted on rail 43 at the opposite end of the mechanism, for supporting an overlying return portion of tape 23 and the second clamping frame 37. Each clamping frame 36,37 engages over the side edges of the respective support plate as illustrated in FIG. 7, and pneumatic rams 46 urge the frames 36,37 up and down between a first position in which they clamp around a frame of the tape, and a second position in which they are raised away from the tape. Each support plate and frame is also linked via arms 47,48, respectively to right and left-hand lead screws 49,51 which are moved in opposite directions by servo motor actuator 50, simultaneously moving each clamping frame 36,37 to the right or left, as indicated by the arrows in FIG. 6.

Figure 8:
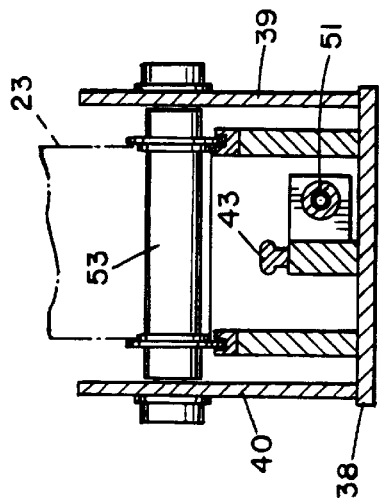
FIG. 8 is a sectional view taken on line 8—8 of FIG. 6.

Two guide rollers 52,53 are rotatably mounted between side walls or plates 39,40 at a location between the two clamping frames. The rollers are fixed to the base plate as indicated in FIG. 8. The printed tape 23 is threaded between the support plate 44 and clamping frame 36, and around the first roller 52, from which it is fed upwardly around a guide roller 24 to the drying station. The tape 23 is then fed back in the opposite direction through the stack and tack station 16 to the indexing mechanism, where it is threaded between support plate 45 and clamping frame 37 and then around the second roller 53, from which it travels to the take-up reel 25.

The indexing mechanism moves the clamping frames 36,37 by a distance equal to the length of one print frame on the printed tape. In the preferred embodiment, this distance is 7". The indexing mechanism indexes the first clamping frame 36 by 7" to the right as viewed in FIG. 6, and simultaneously indexes the second clamping frame 7" to the left, so that the frames move towards one another. In the reverse direction, the frames are then moved apart by an equal distance. When the clamping frames move towards one another, both frames 36 will be clamped down on tape 24, applying an equal pull to the tape at both ends. When the clamping frames move back apart, frame 36 is raised so that it slides back over the indexed tape up to the next print frame to be inspected, while frame 37 is also raised to slide back over the tape 24 to the next clamp position. Thus, the tape is simultaneously pulled one frame through the inspection station and one frame through the stack and tack station onto the take-up reel.

Figure 27:
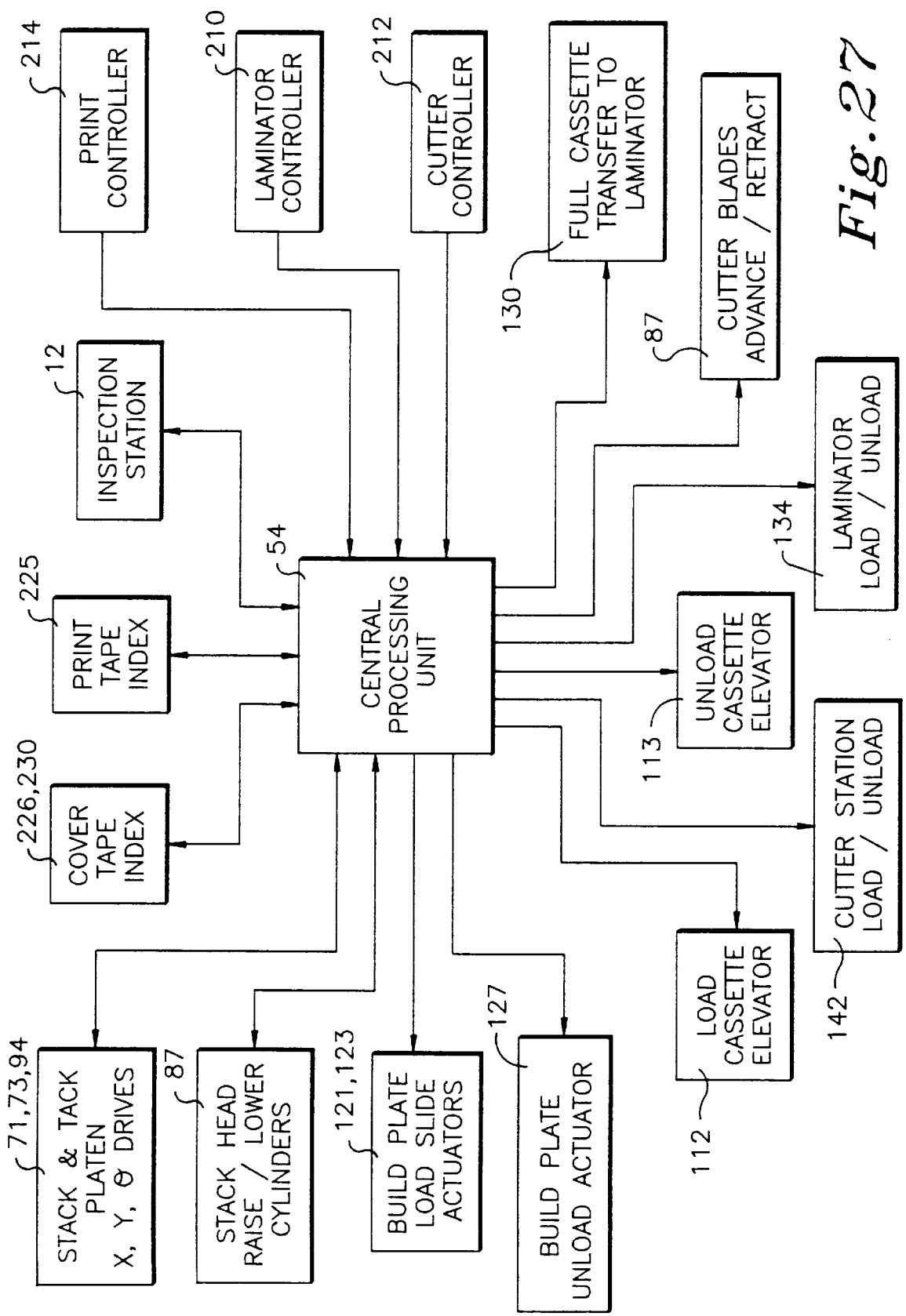
FIG. 27 is a schematic block diagram of the control system for operating the machine of FIGS. 1–26.
Figure 28:
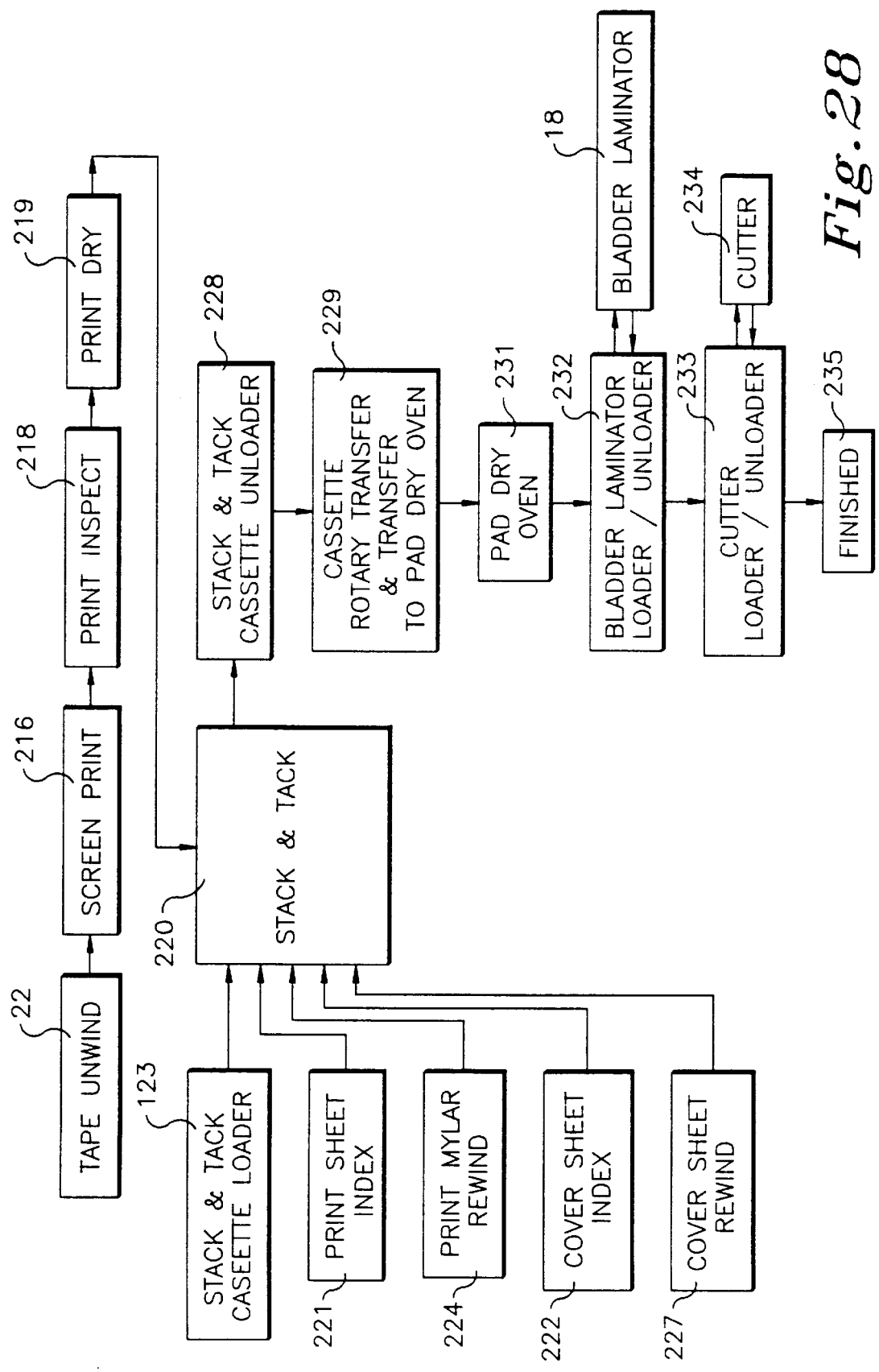
FIG. 28 is a schematic block diagram illustrating overall flow through the system.

When the frame 36 is clamped down around a printed frame 35 on the tape 24, the cameras 41,42 inspect two diagonally opposite fiducials on the printed frame. The output of the cameras is provided to a programmed controller or personal computer, as illustrated in FIG. 27. Controller 54 is programmed to inspect the fiducials for print quality, as well as quality of cut target marks. The microprocessor is also programmed to inspect the size of each fiducial and the separation between the fiducials. The programming will include criteria or tolerance levels for accepting or rejecting a given print or frame. If desired, any rejected print or frame may be electronically tagged and skipped over during the stacking process. If rejects exceed a preprogrammed number in a row, the machine will shut down and prompt the operator for corrective action. After the corrective action is taken, the machine can be restarted at the point of interruption. This station provides the ability to determine the quality of each print layer, so that only the highest quality print layers will go into each stack. This will assure very high yields for the component being manufactured, such as capacitors.

Once the tape has been inspected, the clamping frame indexes to the right, simultaneously advancing the tape by one frame. The clamping frame then opens, and moves back to the left to clamp down on the next indexed frame of the tape. Movement of the tape indexing mechanism is synchronized with clamping and releasing of the tape at the printing station and with operation of the stack and tack station, so that the tape is released at each station prior to the indexing step. Similarly, indexing of the cover tape will be synchronized with operation of the stack and tack station, under the control of the master or central processing unit 54.

Following the inspection station, the tape is indexed through the drying station 14 which is a drying oven for drying the conductive paste used for the printed circuits. The drying oven includes ceramic surface heaters and high air flow to ensure that no trapped solvents will remain when the tape leaves the drying station. If pre-printed rolls of ceramic are to be used, the drying station 14 may be shut down or may be eliminated completely from the system.

Figure 1:
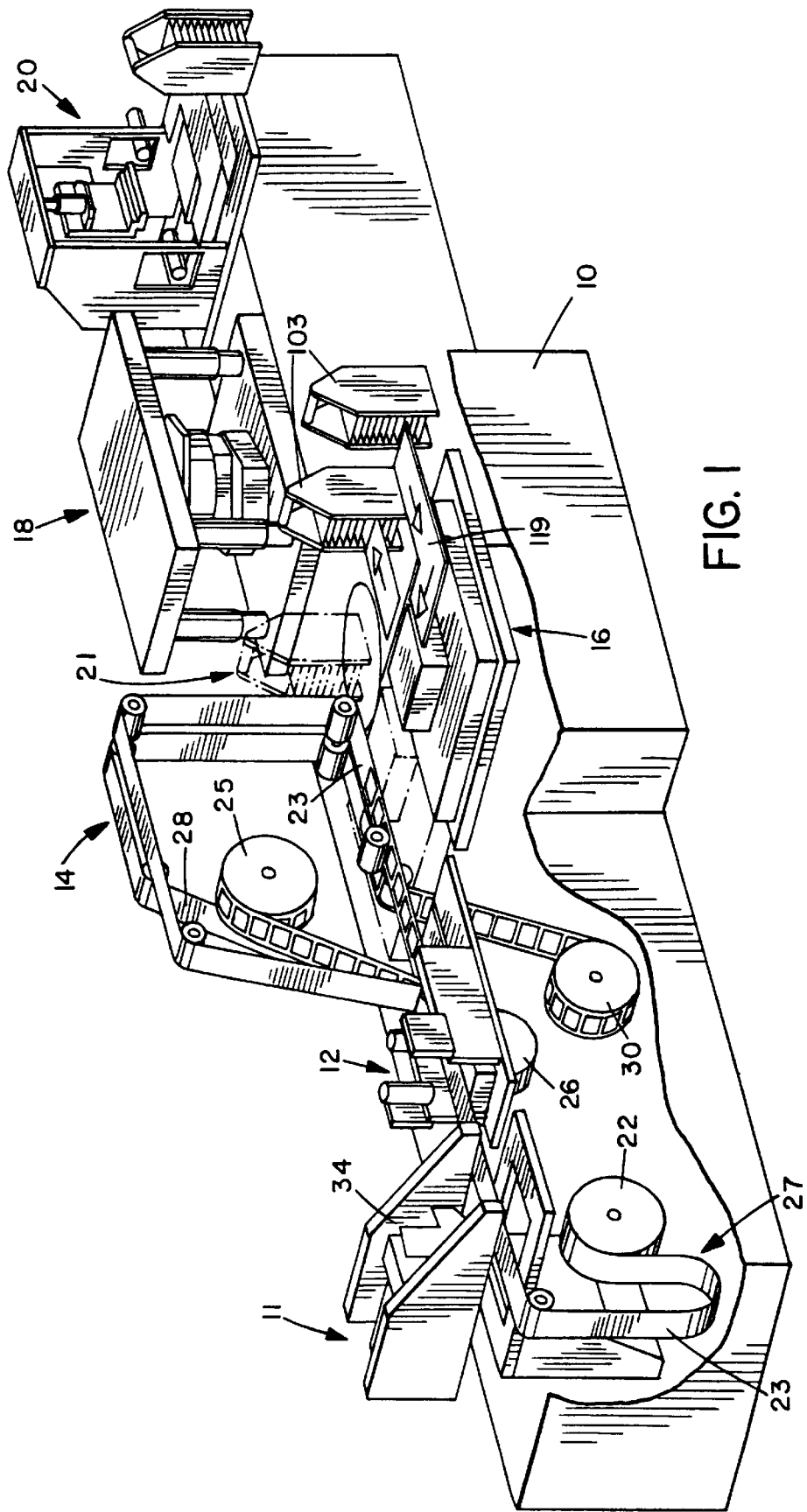
FIG. 1 is a pictorial view of an automated apparatus for making laminated electrical and electronic devices according to a preferred embodiment of the invention.
Figure 10:
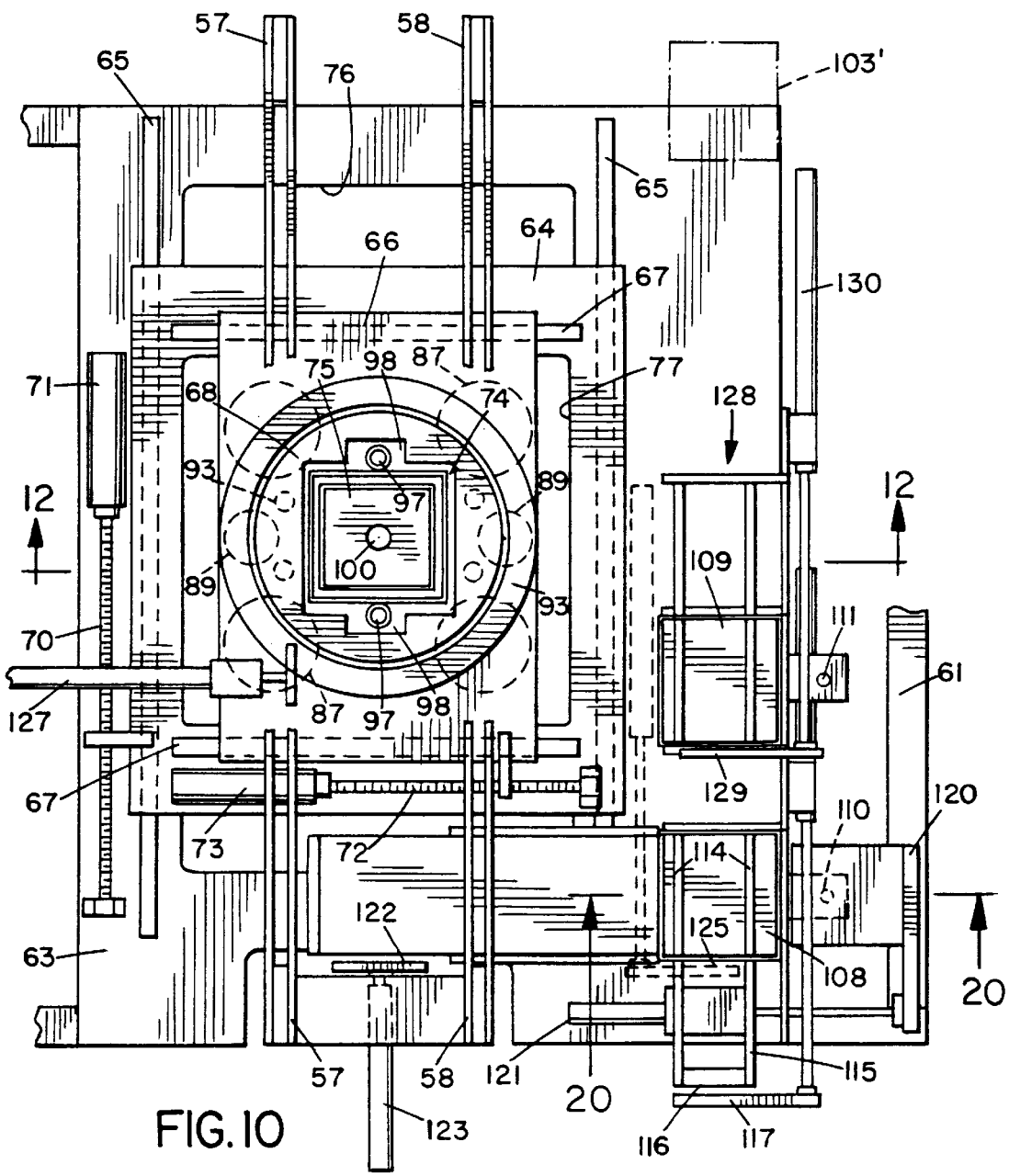
FIG. 10 is a top plan view of the structure of FIG. 9, with portions of the upper structure cut away for clarity.
Figure 11:
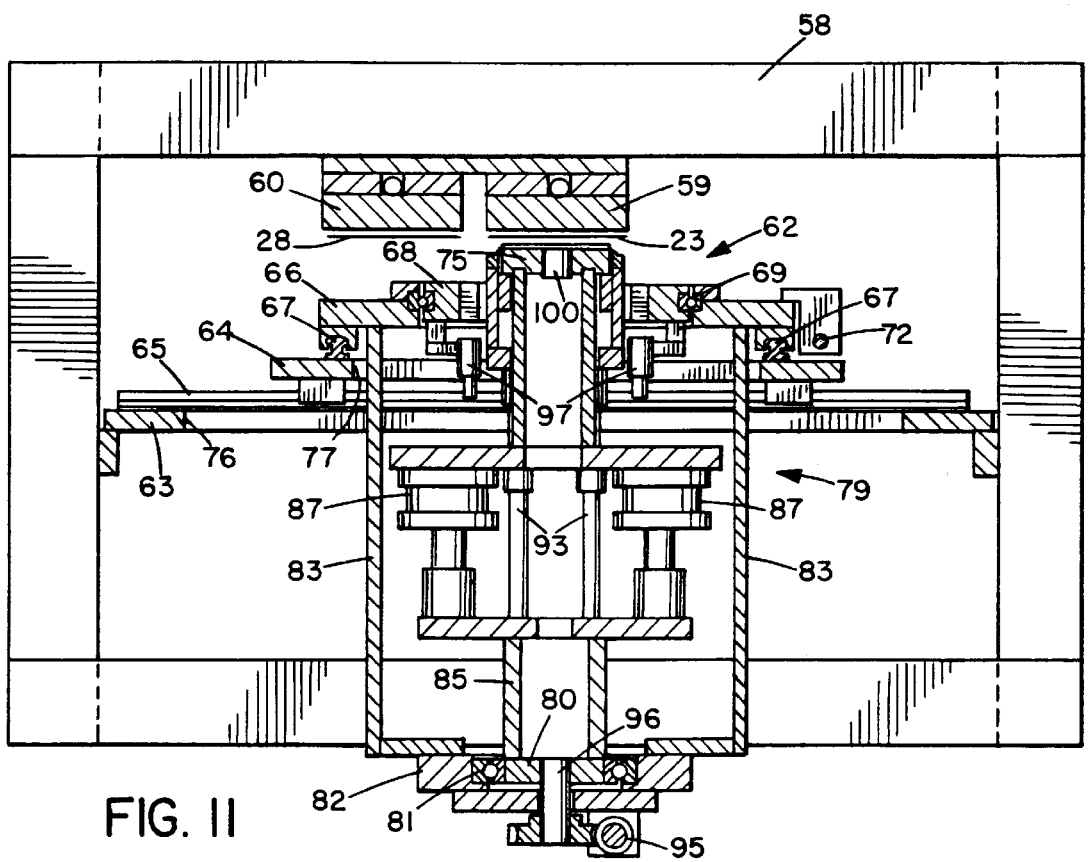
FIG. 11 is a sectional view taken on line 11—11 of FIG. 9.

Both the printed tape 23 and the cover tape 28 are then fed, side-by-side, along parallel paths on conveyor belts 55,56 from the drying station downwardly and then horizontally through the stack and tack station 16, as best illustrated in FIGS. 1, 3 and 11. The stack and tack station 16 will now be described in detail with references to FIGS. 1 and 9–20. A pair of parallel tack support bars 57,58 extend transversely across the two tapes 23,28 at the stack and tack station. A pair of heated tacking platens 59,60 are supported on the support bars 57,58 above the printed tape 23 and the cover tape 28, respectively, as best illustrated in FIG. 11. Bars 57,58 are supported on a suitable support frame 61. Tacking platens 59,60 also include a vacuum chuck for holding successive frames of the two tapes in position during a stack and tack step, as will be explained in more detail below.

A stacking head or platen assembly 62 is supported on a horizontal support plate 63 of the support frame 61 for linear movement in x, y and z directions as well as rotational movement (θ direction). The stacking head assembly basically comprises a first or y-platform 64 slidably mounted on a first pair of y-direction slide rails 65 on the fixed base plate 63, a second or x-platform 66 slidably mounted on a second pair of x-direction slide rails 67 on the first plate 64 for movement in a second, perpendicular direction, and a turntable or θ-platform 68 rotatably mounted in an opening in second plate 66 via bearings 69 for rotation or θ adjustment. The first platform 64 is driven by lead screw 70 and y-servo actuator 71, while the second platform 66 is driven along rails 67 by lead screw 72 and x-servo actuator 73, as best illustrated in FIG. 10.

Figure 9:
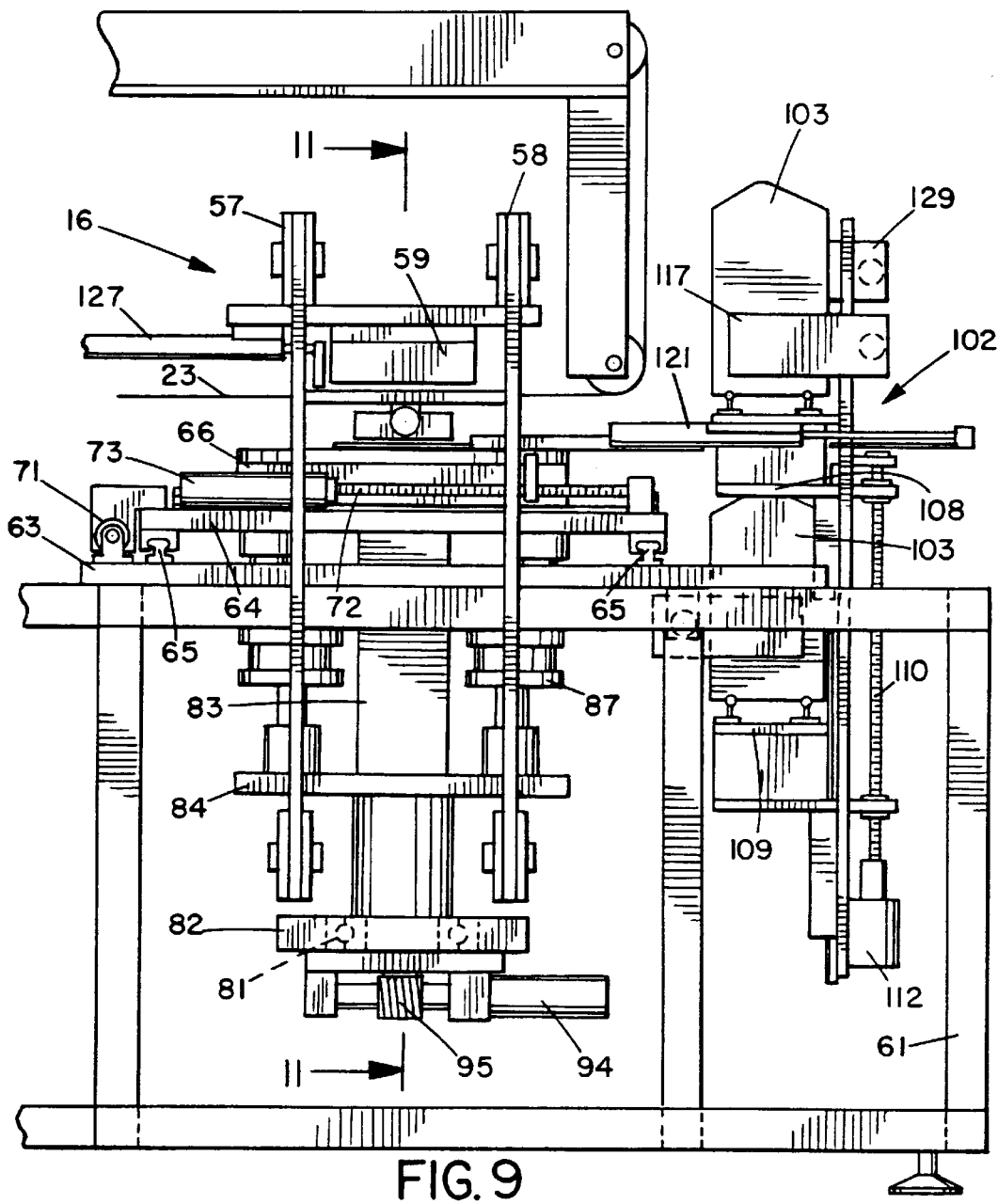
FIG. 9 is a front view of the stack and tack station.
Figure 12:
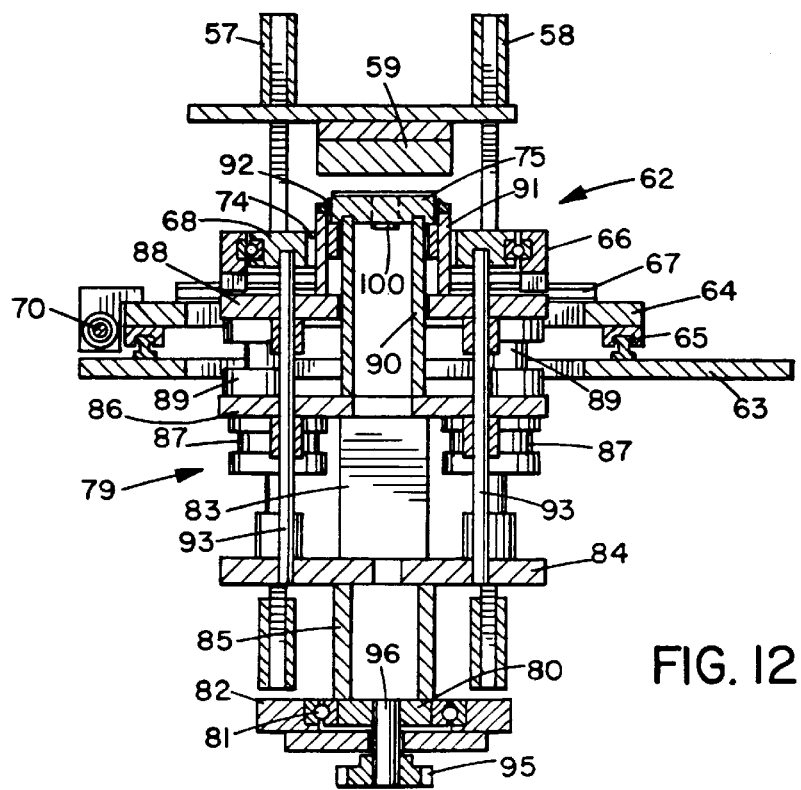
FIG. 12 is a sectional view taken on line 12—12 of FIG. 10.
Figure 13:
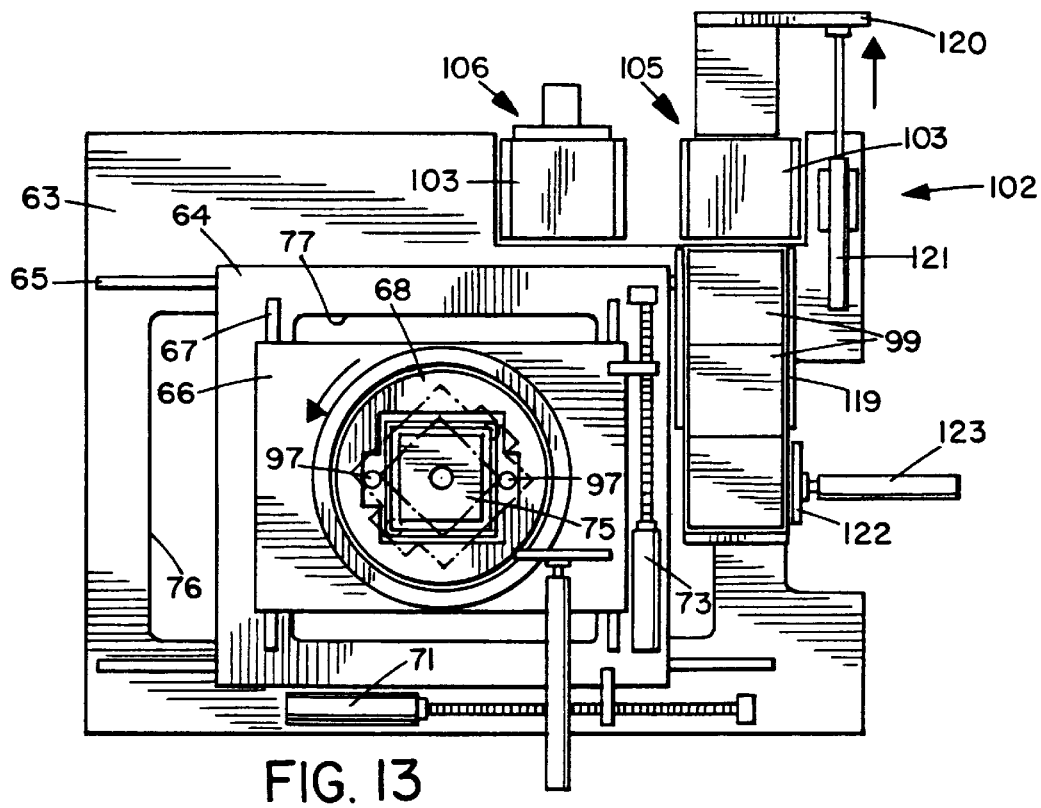
FIG. 13 is a reduced top plan view similar to a portion of FIG. 10, with the mechanism at the print stack and alignment check position.
Figure 14:
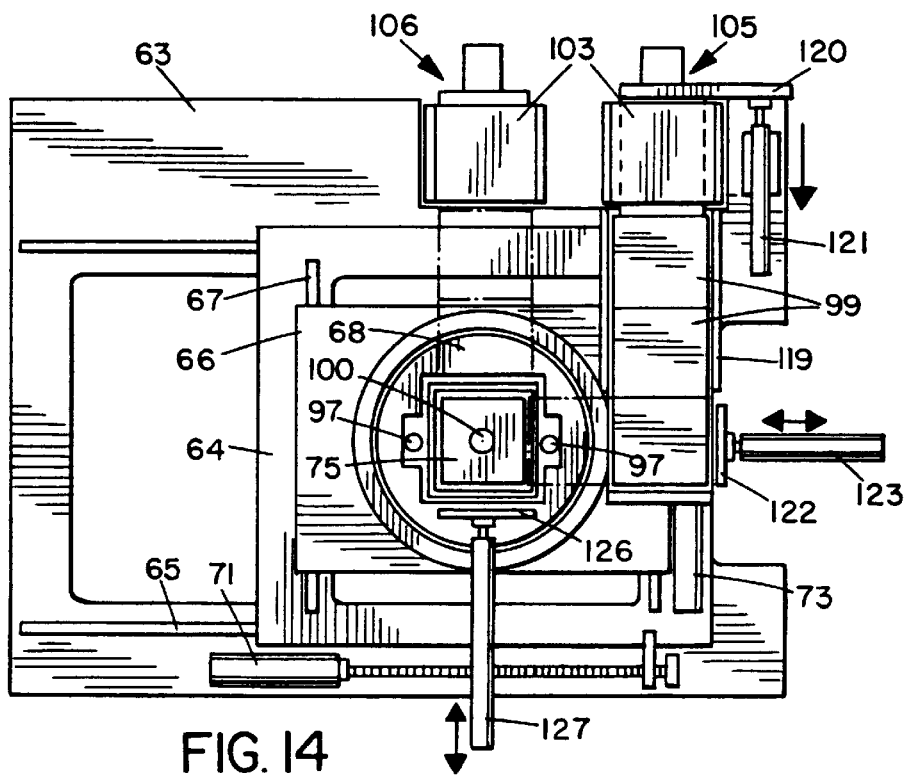
FIG. 14 is similar to FIG. 13, with the mechanism at the load position.
Figure 15:
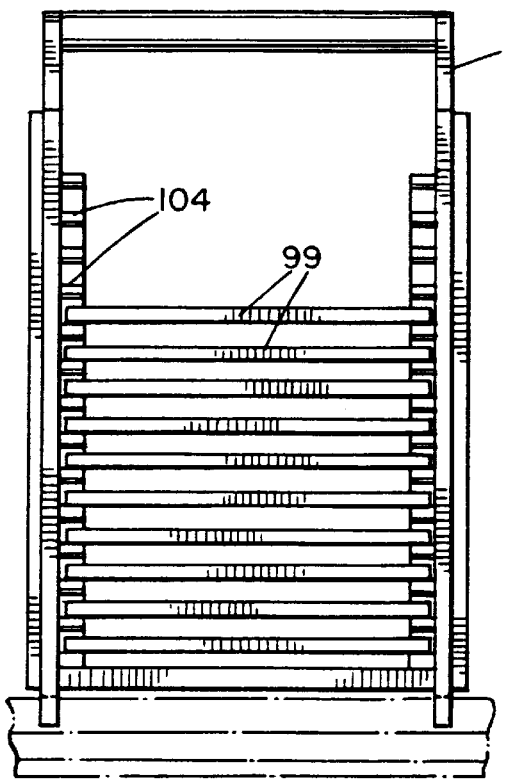
FIG. 15 is an enlarged front view of the cassette for carrying the build-up plates.

Rotatable platform 68 has a central opening 74 in which a stacking platen or head 75 is mounted for vertical or z-direction movement through opening 74. The base plate 63 and first platform 64 have aligned openings 76 and 77, respectively, through which a pneumatic ram assembly 79 extends, as best illustrated in FIGS. 10, 11 and 12. Openings 76 and 77 provide sufficient clearance to allow for the desired x and y direction movement of the stacking head assembly, as best illustrated in FIGS. 10, 13 and 14. The pneumatic ram assembly 79 is mounted at its lower end on lower end plate 80 which is rotatably mounted in bearings 81 of base member 82. Base member 82 is secured via vertical plates 83 to the x-platform 66, as best illustrated in FIG. 9. The assembly 79 includes a first platform 84 secured to end plate 80 via shaft 85, a second platform 86 adjustably mounted above platform 84 via a set of pneumatic rams or cylinders 87 extending upwardly between the four corners of plates 84 and 86, and a third platform 88 adjustably mounted above platform 86 via a pair of pneumatic rams or cylinders 89. The positions of the various cylinders are best illustrated in FIG. 10. The stacking head 75 is supported on the central or second platform 86 via shaft 90 which extends with clearance through a central opening in the third or upper platform 88. A tubular member 91 of square section extends upwardly from the upper platform 88 to engage around the periphery of stacking head 75. Member 91 has a cutting blade 92 machined around its upper edge, as best illustrated in FIGS. 11, 12 and 22. Thus, actuation of cylinders 87 will move the stacking head 75 up and down, while actuation of cylinders 89 will move the cutting blade 92 up and down relative to the stacking head.

Four guide rods 93 extend upwardly from the first platform 84 through aligned openings in platforms 86 and 88 to the rotatable platen, for guiding the platforms as they slide up and down to ensure that they remain aligned with the central axis of the assembly. A drive motor 94 and worm gear 95 are mounted beneath base plate 93 to rotate shaft 96 to which the lower end plate of the pneumatic ram assembly is secured, as best illustrated in FIGS. 9, 11 and 12. Thus, drive motor 94 and worm gear 95 provide θ position adjustment of the stacking head 75.

Two upwardly directed cameras 97 are mounted beneath turntable 68 adjacent opposite sides of stacking head 75, as best illustrated in FIG. 11, and are directed upwardly through openings 98 in the turntable in order to view alignment fiducials on the overlying tape 23, as will be described in more detail below. The stacking head 75 is designed to receive a metal build plate or lamination plate 99 on which the ceramic layers will be stacked. An electromagnet 100 is mounted in the stacking head 75 for securing a plate 99 in position during the stacking and tacking process.

The entire stacking head assembly is moved in the y-direction between three different positions. The first position is a load/unload position, as illustrated in FIG. 14, in which a plate 99 carrying a finished stack is unloaded from stacking head 75 and new plate 99 is loaded onto the stacking head. An automatic feeding system 102 is used to load and unload the build plates 99. The system utilizes a series of cassettes 103, each having a series of vertically spaced shelves or racks 104 on each of which a build plate 99 can be supported, as best illustrated in FIGS. 15–18. The load and unload cassettes may have any desired number of shelves, and in one example each cassette had 20 shelves. Two such cassettes are adjustably supported in a load elevator 105 and an unload elevator 106, respectively, which are positioned at spaced locations adjacent one side edge of the stacking head assembly when it is located in the load/unload position, as illustrated in FIGS. 10, 13, 14, 19 and 20.

Figure 16:
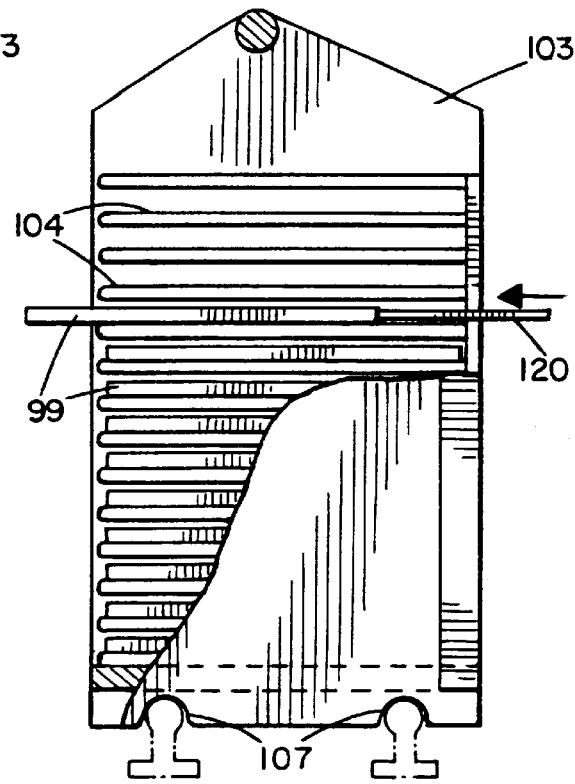
FIG. 16 is a side view of the cassette, partially cut away.
Figure 17:
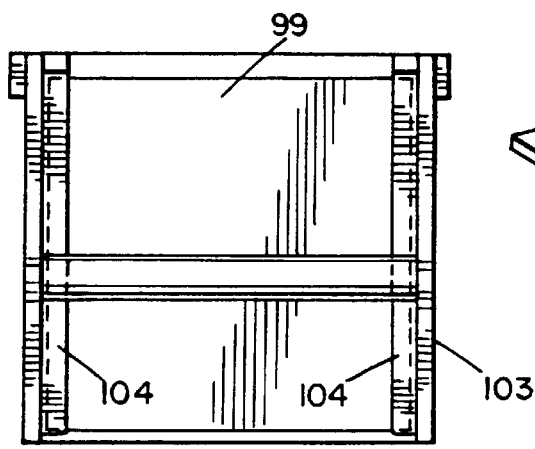
FIG. 17 is a top view of the cassette.
Figure 18:
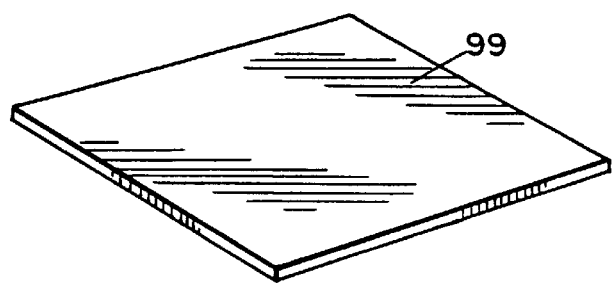
FIG. 18 illustrates a single build-up plate.

Each cassette 103 has a pair of spaced arcuate grooves 107 running across its lower wall, as best illustrated in FIG. 16, which engage over slide rails for guiding the cassettes between various stations in the apparatus. Each elevator 105,106 has a vertically adjustable platform 108,109 secured to a vertical lead screw 110,111, respectively. Each lead screw is rotated by an actuator 112,113, respectively, which raises and lowers the platform in the usual manner. Each elevator platform 108,109 has a pair of short lengths of rail 114 which engage a cassette 103 in the manner illustrated in FIG. 20 when the cassette is mounted in the elevator. Initially, the load elevator platform 108 will be in the uppermost position in its vertical elevator shaft. At this position, the rails 114 are aligned with rails 115 on a fixed loading platform 116, best illustrated in FIG. 19, and a full cassette 103 can be loaded by actuator 117 from the loading platform 116 onto the elevator platform 108.

Figure 20:
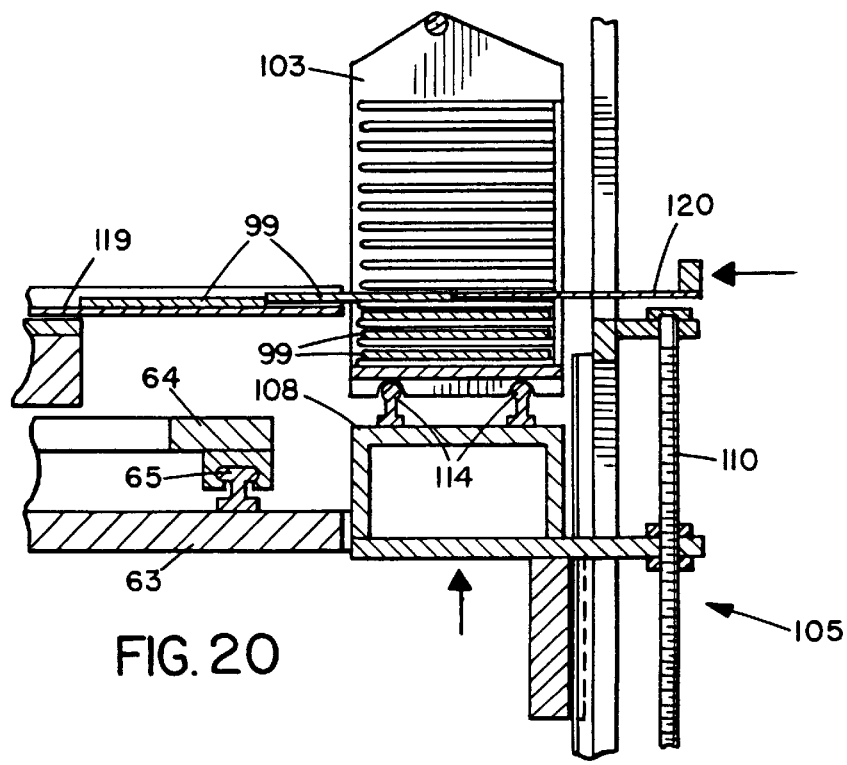
FIG. 20 is an enlarged sectional view taken on line 20—20 of FIG. 10, showing the build plate unloading.

Each build plate 99 is a metal plate with an interface release layer 118 on its upper surface (see FIG. 21), and is preferably prepared with a predetermined number of bottom, blank cover layers stacked on top of the release layer 118 before placing into a cassette 103. When placed on the loading platform 116, each cassette will have a prepared build plate 99 on each of its shelves. When the full cassette is transferred onto the load elevator platform 108 in the uppermost position, the lowermost shelf 104 will be aligned with a track 119 for guiding plates 99 onto the stacking head 75 in the load/unload position, as best illustrated in FIGS. 13, 14 and 20. A first, plate loading pusher member 120 is secured to an actuator 121, and will be aligned with a plate 99 in the lowermost shelf. The pusher member 120 is extended to push the aligned plate 99 off the shelf and onto the track 119, as best illustrated in FIGS. 14 and 20. After the plate is pushed onto the track, the pusher member is retracted out of the cassette, as indicated in FIG. 13, and the loading platform is lowered by one shelf, until the next shelf and plate are aligned with the pusher member. The sequence is repeated until a series of three plates 99 have been pushed successively onto the track, as indicated in FIGS. 13 and 14. At this point, the first plate 99 will be aligned with a perpendicular, second loading pusher member 122 which is actuated by actuator 123 to push that plate onto the stacking head 75, as indicated in FIG. 14.

Figure 19:
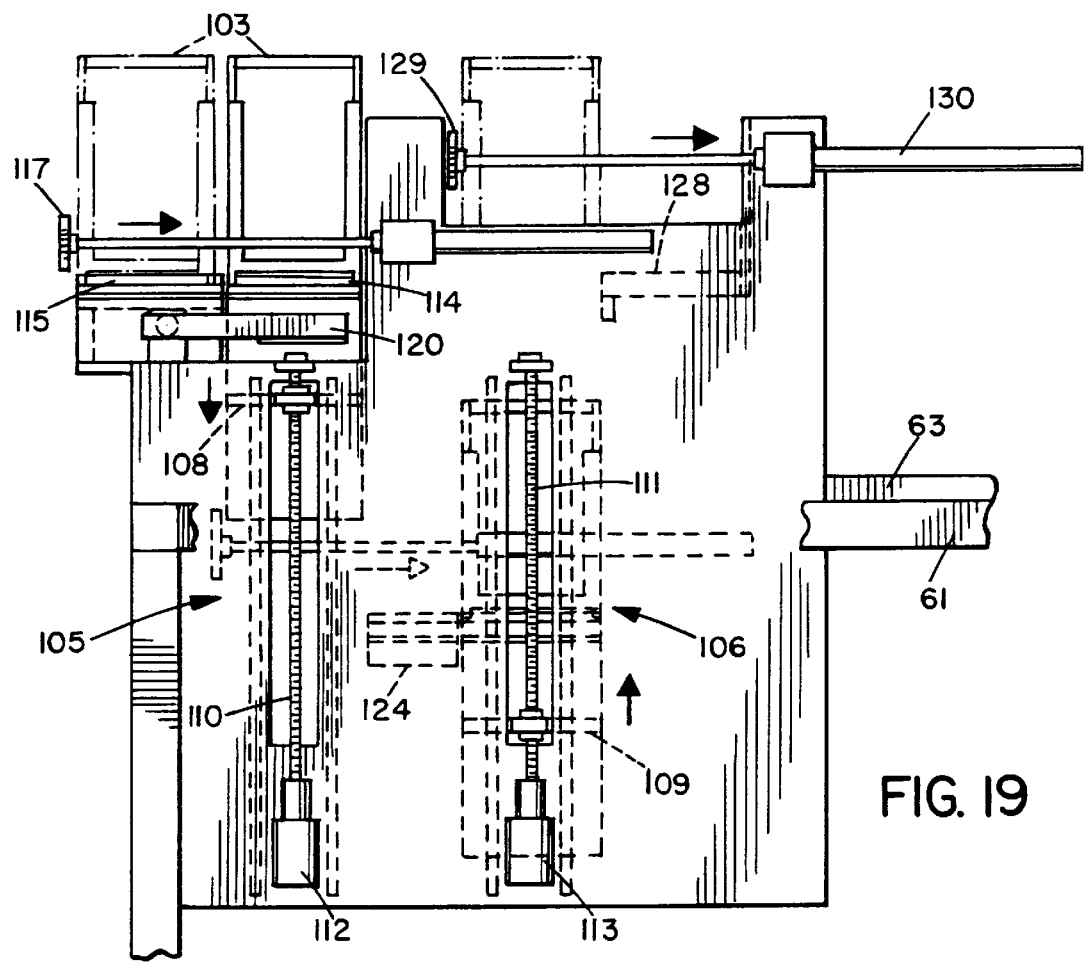
FIG. 19 is a view from the right-hand side of FIG. 9, showing the cassette moving actuators.

Once a cassette 103 has been emptied, the load elevator platform will be in the lowermost position and its track will be aligned with a fixed transfer track 124, illustrated in dotted outline in FIG. 19, between the load and unload elevators. The unload elevator platform 109 will also be in the lowermost position in its elevator shaft, with rails 114 aligned with the transfer track 124. At this point, an empty cassette 103 can be pushed by transfer pusher member 125 from the load elevator to the unload elevator. The empty cassette will then be positioned with its uppermost shelf 104 aligned with the stacking head 75 in the load/unload position, as best illustrated in FIG. 14. An unload pusher member 126 can then be actuated by actuator cylinder 127 to push a plate 99 carrying a completed stack from the stacking head 75 into the empty shelf 104. The cassette 103 is then raised by one shelf, and the procedure is repeated until cassette 103 is full, at which point it will be in a position aligned with a second transfer track 128 for transfer to the next station in the apparatus. The full cassette 103 is pushed from unload elevator 106 onto the transfer track 128 via pusher 129 operated by actuator 130, as best illustrated in FIG. 19. Elevators 105,106 and the various associated actuators and pusher rods therefore comprise the plate feed system for feeding plates 99 onto and off the stacking head 75.

Once an empty build plate 99 is positioned on the stacking head 75, the y-servo is actuated to move the assembly from the load/unload position into either one of two possible stacking positions, either aligned with the tacking platen 59 and the printed tape 23, or aligned with the tacking platen 60 and cover tape 28, depending on preset program instructions. If one or more printed layers of tape are to be applied to the build plate at this time, the assembly is moved into y-position alignment with the tacking platen 59. Output from cameras 97 is used in order to control the x and θ servos until the build plate is properly aligned with the overlying printed tape, using the alignment fiducials printed on the tape. At this point, pneumatic rams 87 are actuated to raise platform 86, and thus the stacking head 75, until the uppermost layer on the build plate 99 contacts the printed tape 23, as best illustrated in FIG. 21. The printed layer will be tacky due to contact with heated platen 59, and will tend to adhere to the uppermost layer 131 on the plate 99. Pressure is applied via the rams 87 for a predetermined length of time to ensure that the printed frame is fully adhered to the stack or bar 132. At this point, the pneumatic rams 89 are actuated to raise the platform 88, and thus the attached cutting member 91, until the blade edge 92 cuts through the ceramic layer around the printed frame, excising the frame from the Mylar carrier layer 31, as best illustrated in FIG. 22. When the stacking head 75 is lowered, an additional layer 131 will be adhered to the stack. The same procedure is used to excise cover layers from cover tape 28 when the stack and tack assembly is aligned with the second tacking platen 60.

The stacking head is driven into an appropriate position either aligned beneath the printed tape or the cover tape, depending on whether a printed layer or a blank, cover or interleaf layer is to be applied to the stack at this point, according to stored program instructions. Typically, each stack will have four or five layers of unprinted ceramic at both the top and bottom. The bottom covers may be provided onto the build plate prior to placing in the cassette, or may be applied at the stack and tack station. In addition, some intermediate layers may be programmed to be blank based on thickness requirements. Assuming a blank or cover layer is to be applied, the stacking head is driven into position in alignment with the cover tape. Since there is no printed pattern, no special alignment of the stacking head in x, y and θ directions is necessary at this position. The currently indexed portion of the cover tape will be aligned beneath the heated platen and will be adhered to the platen via a vacuum head. At the same time, the stacking head is raised into an elevated position, and the base plate is raised until the build plate or uppermost layer of the stack, if build-up has already started, is flush against the ceramic layer of the tape. The heat and pressure applied by the platen will cause the ceramic to adhere to the build plate or underlying layer of the stack. The cutting blades are then extended upwardly to make a perimeter cut, excising a layer of ceramic of area corresponding to the area of the underlying build plate. The blades are then retracted, and the base plate is lowered down, with the excised portion of the ceramic adhered to the build plate or underlying layer of the stack.

The cover tape is then indexed to align a new portion of the ceramic with the build plate, and the procedure is repeated if additional cover or intermediate layers are required. The tape with cut-away regions of ceramic will be indexed forwards onto the take-up reel for rewinding. Once the desired number of cover layers have been applied to the stack, the stacking head is moved into alignment with the printed tape. The procedure for applying one or more printed ceramic layers is much the same as described above in connection with the unprinted or cover layers, apart from the fact that the stacking head must first be accurately aligned depending on the position of the registration fiducials on the frame or pattern to be applied to the stack. An offset may be required between one printed layer and the next, and may be pre-programmed so that the microprocessor will control the turntable to rotate until the stack reaches the desired orientation relative to the printed pattern on the overlying portion of the tape. Additionally, adjustment of the position of the stack may be required based on the position of the alignment fiducials on the overlying printed pattern, as detected by cameras 54. Thus, the stacking head may be properly positioned prior to actual stacking of the next layer.

The currently indexed portion of the printed tape overlying the stacking head will be held against the heated platen with a vacuum chuck. The cameras 54, which face upwardly towards the tape, will read the location of the fiducial marks and will feed the location back to controller 30. The tacking head is then shifted to the proper position based on the desired alignment with the printed pattern, using the x, y and θ drives, and a redundant check is made. As long as the position is within programmed tolerance, the tacking procedure continues.

Once the tacking head is aligned with the alignment fiducials, further adjustments may be made if necessary to achieve a programmed offset, for example any offset required for a given part size, or to rotate the tacking head if an offset is desired between adjacent layers. By using a floating tacking head, the actual print location of the pattern on the ceramic tape is not critical, since the tacking head can be aligned to the pattern regardless of the actual location. The only requirement for the tacking procedure to work is that the fiducials are in the field of view when the tape transport or indexing stops.

As soon as the tacking head is in the desired position relative to the overlying print pattern, it will be raised upwardly by piston and cylinder mechanism into the elevated position illustrated in FIG. 21, and the base plate 46 will also be raised until the upper layer of the stack contacts the ceramic. The heated platen will cause the ceramic to detach from the underlying base layer of the tape and adhere to the stack. The cutting blades are then raised to excise the printed portion from the tape, and the blades are retracted while both the base plate and the tacking head are lowered back down. The carrier tape with excised portions is wound up onto the take-up or rewind reel or roller 28. After the layer has been attached to the stack, the next frame or printed pattern is indexed into position over the tacking head for alignment and tacking in the same way. After the programmed number of printed layers are reached, the stack is moved back under the cover tape for attaching a series of cover layers to the top of the stack. Finally, the stacking head with the completed stack is moved back to the load/unload position. The base plate will be raised into alignment with the upper surface of the stacking head, and the pusher bar 126 will be actuated to push the stack off the base plate and into an aligned shelf of the unload cassette.

After a finished stack has been unloaded, the load cassette is indexed upwardly by one shelf, and a new build plate is ejected from the cassette and onto the stacking head using pusher bars 120,122. The next stack is built up in the same way, and the unload cassette is indexed upwardly by one shelf so that the finished stack can be loaded onto an empty shelf. Once the load cassette is empty and the unload cassette is full of finished stacks, the full cassette 103' is pushed on suitable rails (not illustrated) through drying chamber 21, which will remove any trapped solvents which remain in the built-up stack. Full cassettes are automatically moved through the drying chamber up to the lamination station load assembly 134 via conveyor rails and turntable 133 as illustrated schematically in FIG. 23. It will be understood that the transfer mechanism is similar to that described in detail above in connection with the stack and tack station.

The lamination station load assembly 134 also comprises a vertical elevator 135, which is of similar structure to the load and unload elevators 105,106 of the stack and tack station, and will therefore not be described in detail. However, rather than having separate load and unload elevators, only a single elevator is used at the lamination station, and each build plate and stack is pushed from the cassette into the laminator by pusher bar 136. After lamination is complete, the build plate and laminated stack is pushed by a suitable actuator, such as another pusher bar (not illustrated), back into the same shelf of the cassette, and the cassette is then raised by one shelf to align the next build plate and stack with pusher bar 136.

The lamination station 18 preferably comprises a hydrostatic lamination unit of the type described in U.S. Pat. No. 4,636,275 of Ronald A. Norell. Lamination station 18 has a lamination cavity 139, and the bars are deposited one at a time into the cavity using the pusher bar 136 in a similar manner to the stack and tack station. When a bar is positioned in the cavity, the cavity is clamped shut. A preprogrammed amount of vacuum is drawn and the desired pressure, up to 6,000 psi, is applied. The temperature in the cavity may be controlled up to 120° C., and the pressure application time is also controlled according to program instructions. The lamination unit applies equal lamination pressure over the entire surface of the bar or stack via actuator 140, so that the layers are evenly bonded throughout. After lamination is complete, the laminated bar or stack is pushed out of the cavity and into an empty shelf of the cassette. A new stack or bar is then loaded into the cavity and the procedure is repeated. Once the cassette is full of laminated stacks or bars, full cassette 103" is automatically transported from the elevator 135 as indicated in dotted outline in FIG. 23, along suitable rails in a similar manner to the transfer from the stack and tack station.

At the cutting station, the cassette 103" carrying the laminated stacks or bars will be transported by a suitable transfer mechanism into a fourth elevator 142 of identical structure to elevator 135. Initially, the uppermost shelf of the cassette is aligned with cutting stage 144 of the cutting station, and the bar on that shelf is pushed by pusher bar 146 onto a conveyor 148 which transports it to the cutting stage 144, which is mounted on a turntable 149 for rotational adjustment. The turntable is mounted on a y-stage for y-direction adjustment of the cutting stage position. Pusher bar 146 is operated by pneumatic actuator 147. The cutting station may comprise any conventional chip cutting unit. In a preferred embodiment of the invention, the Model CS-5006C multi-sequence cutter/scriber of Pacific Trinetics Corporation, Carlsbad, Calif. was used as the cutting unit. This device uses a hot knife cutter, and includes cameras for auto alignment of the cutting stage beneath the cutters based on the position of chip cutting fiducials on the bar or pad which are viewed by the cameras. Any angular or y-direction adjustment required is performed automatically through the vision system interface with the motion control system. The cutter has its own standard control unit, and is therefore not controlled by the system controller 20. After completion of the cutting operation, the cut ceramic bar is moved back onto the same shelf in the cassette 103 by any suitable transfer mechanism, such as an oppositely directed pusher bar (not illustrated). The cassette is indexed by actuator 150 in the elevator by one shelf, and the next bar is cut in an identical manner. Once all bars in a cassette have been cut, the cassette is removed by an operator for subsequent operations, such as chip firing.

Operation of the entire system will now be described in more detail with reference to FIGS. 27–33, which are schematics and flow diagrams of the control system. Certain operations are under the control of the central microprocessor 54, as illustrated in FIG. 27, while other stations have their own internal microprocessor or controller, which is linked to the microprocessor 54 for timing purposes but which otherwise works independently. For example, the lamination station, cutting station and printing station (if present) include their own internal controllers 210,212,214, respectively, which are linked to central controller or microprocessor 54 as indicated in FIG. 27. The overall flow through the system is illustrated schematically in FIG. 28. Tape is indexed first through the screen printer, where it is clamped and printed in screen print step 216. Next, it is indexed through the printed inspection station, where it is clamped and inspected in step 218. The inspected tape frame is then released and indexed to the drying station where the print is dried in step 219. The tape then indexes to the stack and tack station, for a stack and tack routine 220. This includes indexing of both the printed tape (221) and the cover tape or sheet (222), operation of the stack and tack cassette loader (223), rewinding the printed and cover tapes after cutting out the desired frames (224,227), and operation of the stack and tack cassette unloader (228) to load stacked parts and transfer a full cassette to the drying oven (229).

After the drying step 231, the cassette is transferred to the laminator loader/unloader, which is controlled (232) to transfer parts to and from the bladder laminator 18. The laminator operates under the control of its controller to laminate the part under the preset conditions. When a cassette is loaded with laminated parts, it is transferred to the cutter loader/unloader (233) where parts are successively loaded into the cutter, cut into individual component sizes (234), and the cut components are loaded back onto the cassette of finished components (235).

Figure 29A:
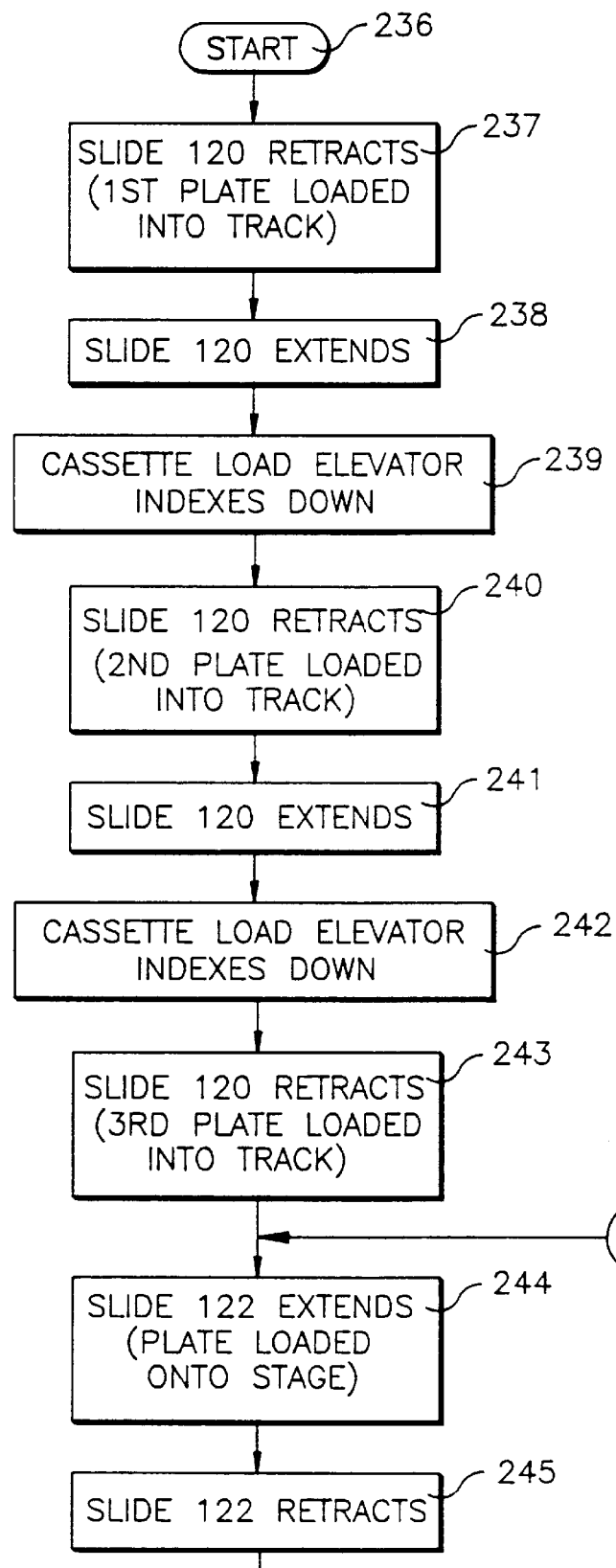
FIGS. 29A and B are flow diagrams illustrating the loading sequence for loading a metal build plate onto the stacking head.
Figure 29B:
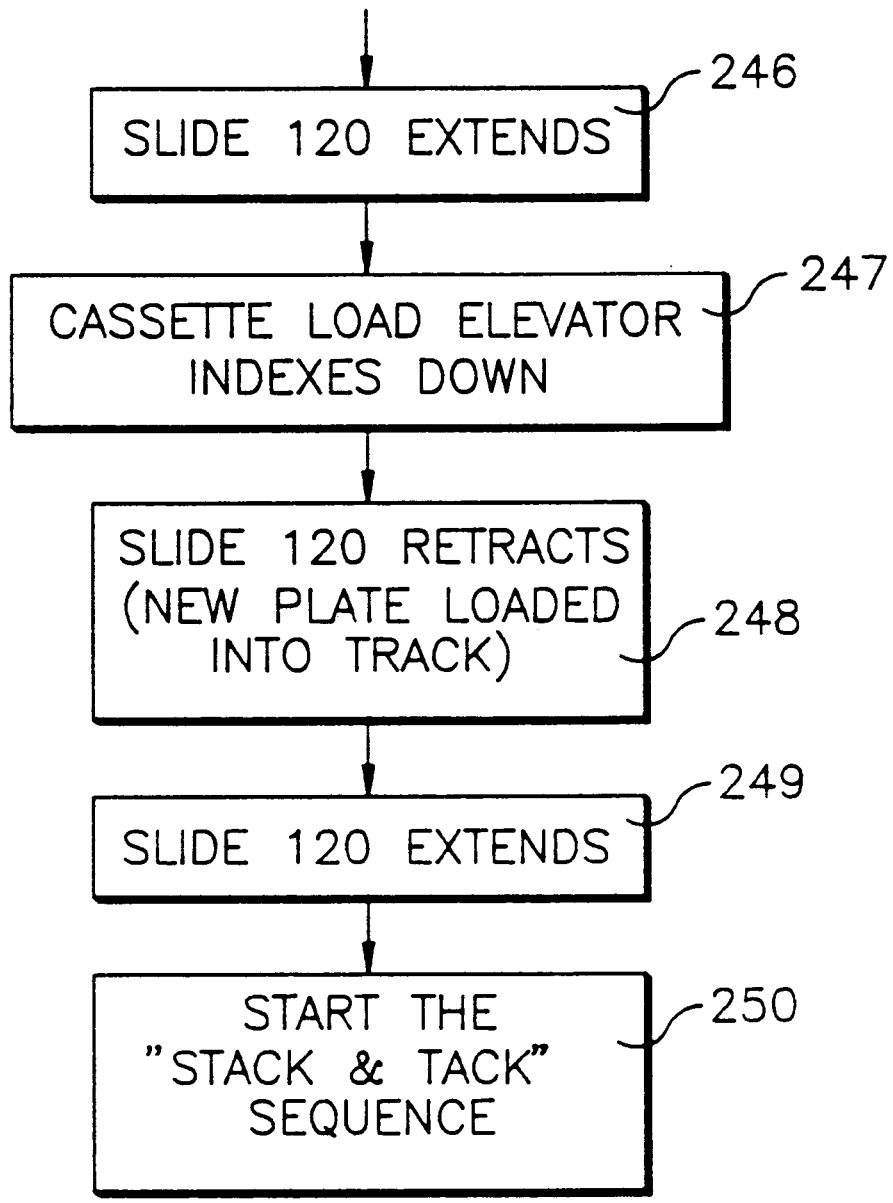
Figure 30A:
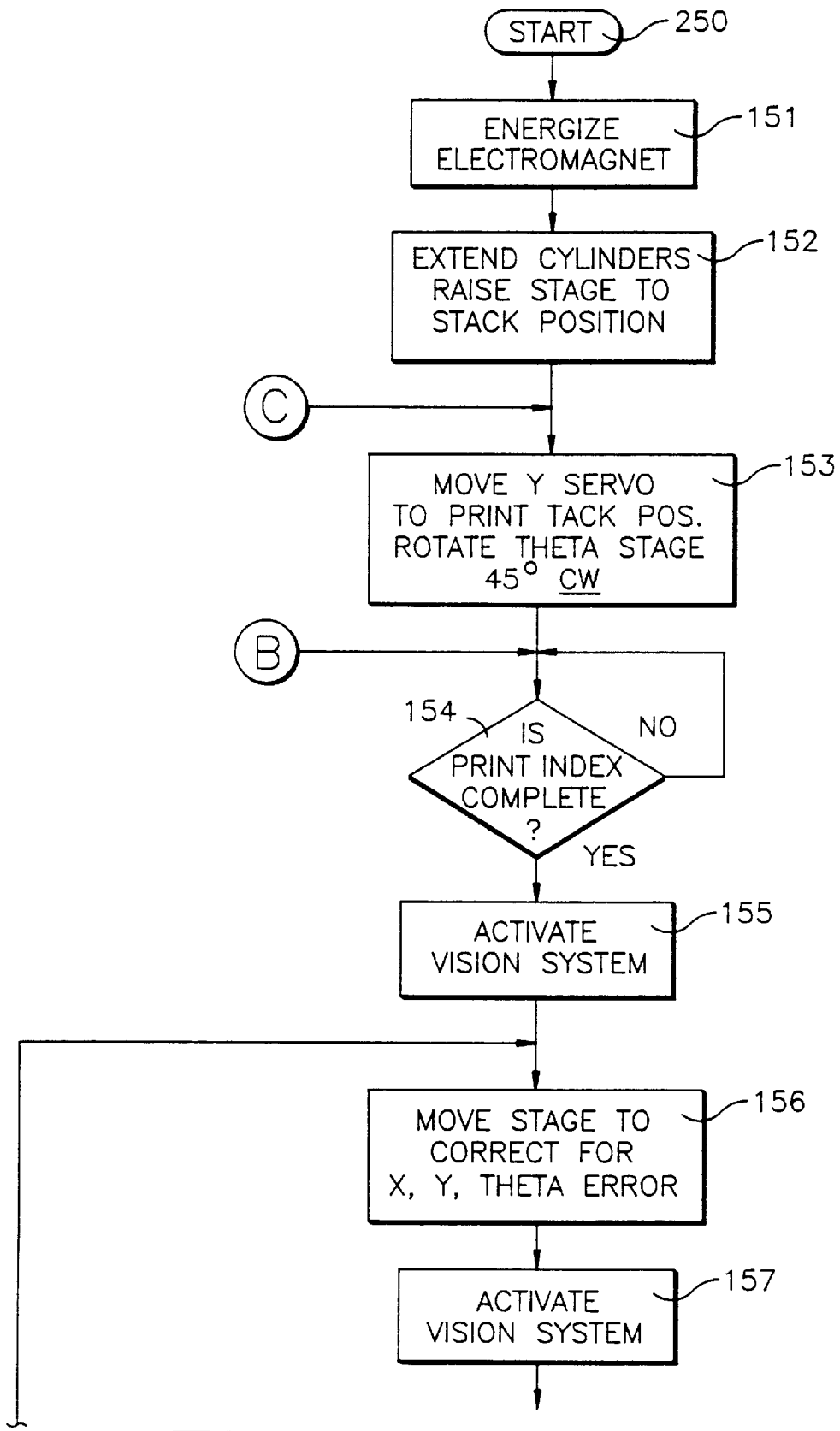
FIGS. 30A–D are flow diagrams illustrating steps in a program for controlling the stack and tack procedure.
Figure 30B:
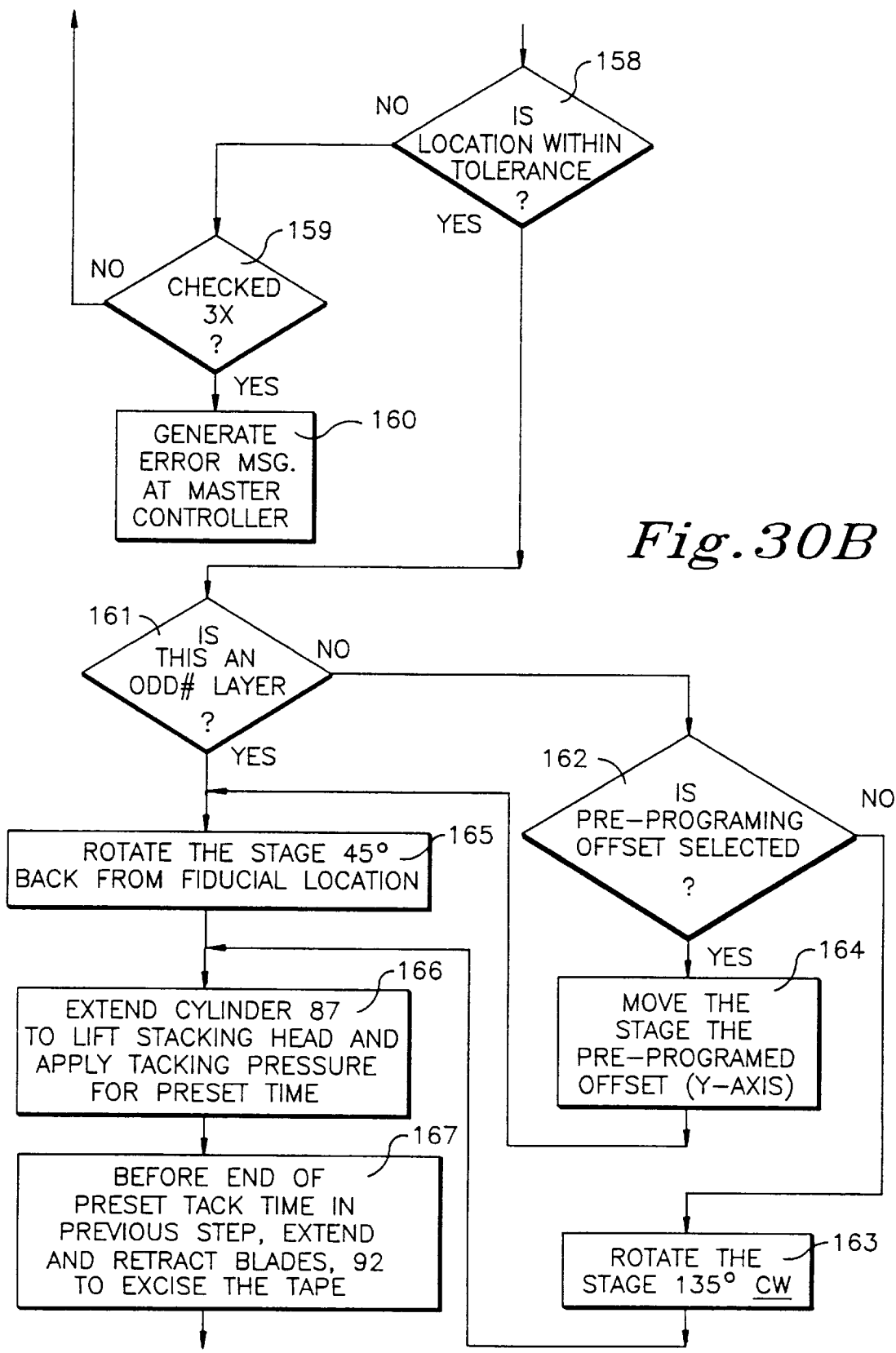
Figure 30C:
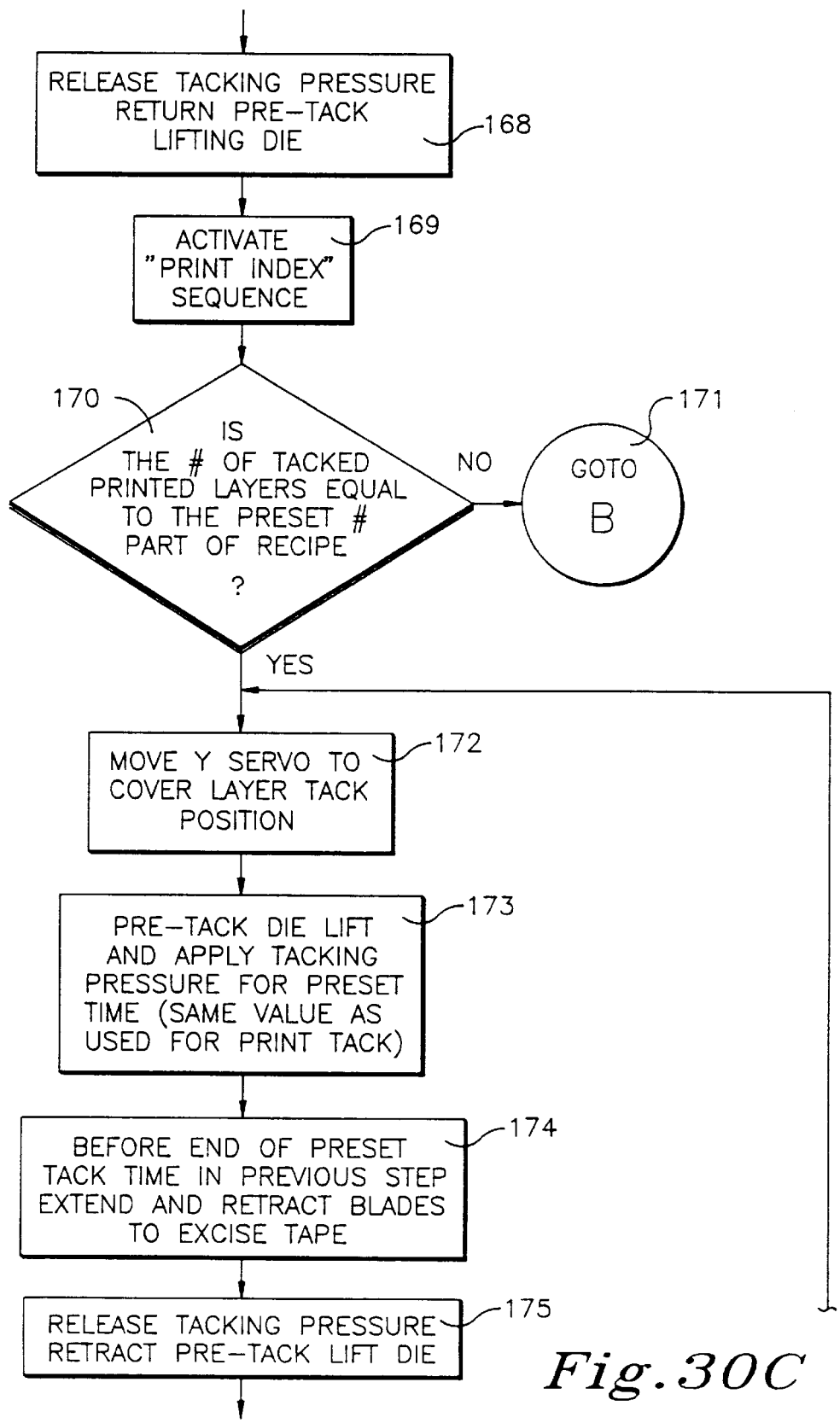
Figure 30D:
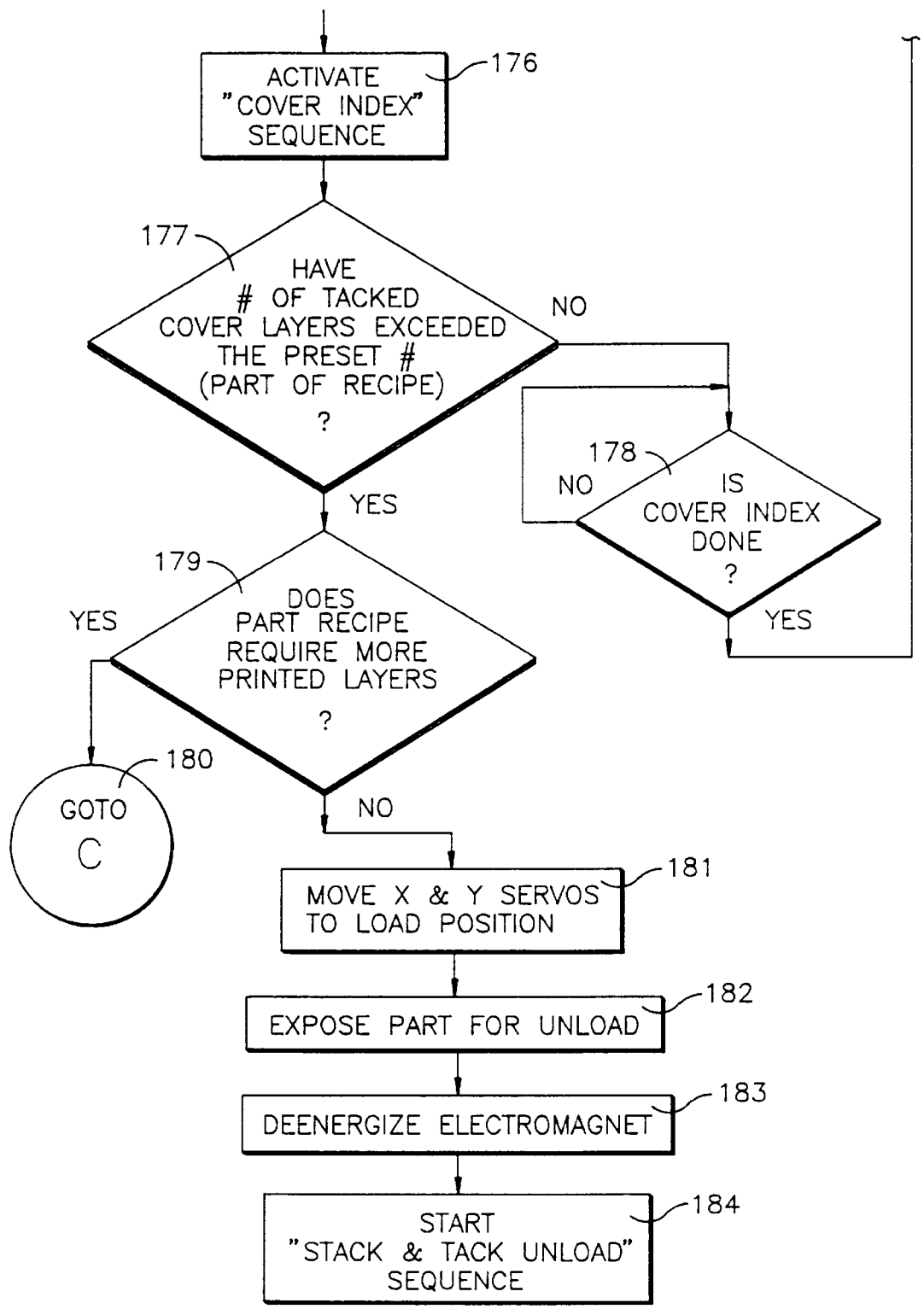

The loading sequence for loading a metal build plate onto the stack and tack stage or platen will now be described in more detail with reference to the flow diagrams of FIGS. 29A and B. The first slide or pusher bar 120 is associated with two switches, one for detecting when the slide is retracted and the other for detecting when it is fully extended. Initially, a full load cassette with metal build plates in each shelf will be in the uppermost position in the elevator, with the lowermost shelf aligned with pusher bar or slide 120. This is the situation at the start 236 of a loading sequence. The slide 120 is then retracted until the retract switch is actuated, simultaneously loading a first build plate onto the track 119, in step 237. The slide is then extended until the extend switch is actuated (238). At this point, the load cassette elevator cylinder 112 is indexed down by a distance sufficient to align the next shelf of the cassette with track 119 (step 239). The slide 120 is then retracted again, loading a second plate onto track 119 and simultaneously pushing the first plate along the track (step 240). The slide is extended (step 241), and the elevator is indexed down to the next shelf (step 242). The slide is retracted again, loading a third plate onto the track (step 243), and simultaneously pushing the first two plates forwardly along the track, until the first plate is aligned with the second slide or pusher bar 122. At this point, the slide is extended until an extend switch is actuated, pushing the first plate onto the stacking head 75 (step 244). The slide 122 is then retracted (step 245). The first slide 120 is then extended (step 246), and the load cassette elevator indexes down one more shelf (step 247). The first slide retracts to load the next plate onto the track (step 248), so that the second plate is in position ready for loading onto the stacking head 75 at the appropriate time. The first slide then extends (step 249), and the program proceeds to the stack and tack sequence or sub-routine (step 251).

The stack and tack sequence is illustrated in FIGS. 30A–D. Once the first plate is loaded onto the stacking head and the next plate is ready for loading, after step 249 in FIG. 29B, the stack and tack sequence starts (250). First, electromagnet 100 is energized to hold the plate onto the stacking head base (step 151). Then the cylinders 87 are extended to raise the stacking head to the stacking position, as illustrated in FIG. 21 (step 152). The y-direction motor is then actuated to move the stage to the stack/tack position of FIG. 13 (step 153). In the next step 154, a determination is made of whether the print index sequence is complete, which is checked according to a flag set by the print index sequence of FIG. 32, as described in more detail below. If not, the routine returns to the sequence checking step 154 repeatedly until the print index complete flag is received. If no complete flag is received within a certain number of cycles, an error message will be generated.

Once the index flag is received, the vision system is activated (step 155). The position of fiducial marks on the indexed print frame are located by the cameras 97 mounted on the stacking head 75, and checked with the program instructions regarding the desired orientation for this particular layer. The stage is then moved in the x, y, θ directions using motors or actuators 71,73,94 in order to correct for any error between the detected orientation and the desired orientation (step 156). The vision system is again activated (157), and in the next step 158, a determination is made of whether the stage location is within predetermined tolerances relative to the fiducials. If not, and the position has been checked no more than three times (step 159), the program returns to step 156 to reposition the stage. If the position has been checked more than three times in step 158, an error message is generated at the master controller (160), indicating to the operator that there is a potential problem with the stage positioning system. If the location is detected to be within tolerance levels, a check is made of whether the next layer to be stacked is an odd number layer (161). If not, a check is then made of whether a preprogrammed offset has been selected (162). If an offset is programmed, the stage is moved in the y-direction by an amount equal to the preprogrammed amount (step 164), before the program returns to the main path after step 161. In the next step 165, the stage is rotated back 45° from the fiducial location. If no offset has been programmed, this implies that 180° rotation is selected in the recipe, and the stage is rotated 135° in step 163. The program then returns to the main program path after step 165.

In the next step 166, after positioning is complete, the lifting cylinders 87 are extended so that the plate contacts the indexed tape segment. Simultaneously, tacking pressure is applied to cylinders 87 for a preset time, which will be set by operator input at the start of the operation. During the tacking period, before the end of the preset tack time, the cutter blade activating cylinders 89 are extended and retracted (step 167) in order to excise the printed tape layer from the tape. Subsequently, at the end of the preset tacking period, the cylinders 87 are all retracted to release the tacking pressure and lower the tack and stack head 75 (step 168). At this point, the print index sequence is activated (169) to index the tape by one frame length so that the next printed frame of the tape is aligned with the stacking head. A check is then made (step 170) to determine whether the number of unprinted layers already tacked at this point is less than the programmed number of printed layers required at this point in the stack. If so, the program then returns to point B (step 171), and the sequence is repeated to orient the stack relative to the next layer to be stacked, and to tack and excise that layer in the same procedure.

Figure 33:
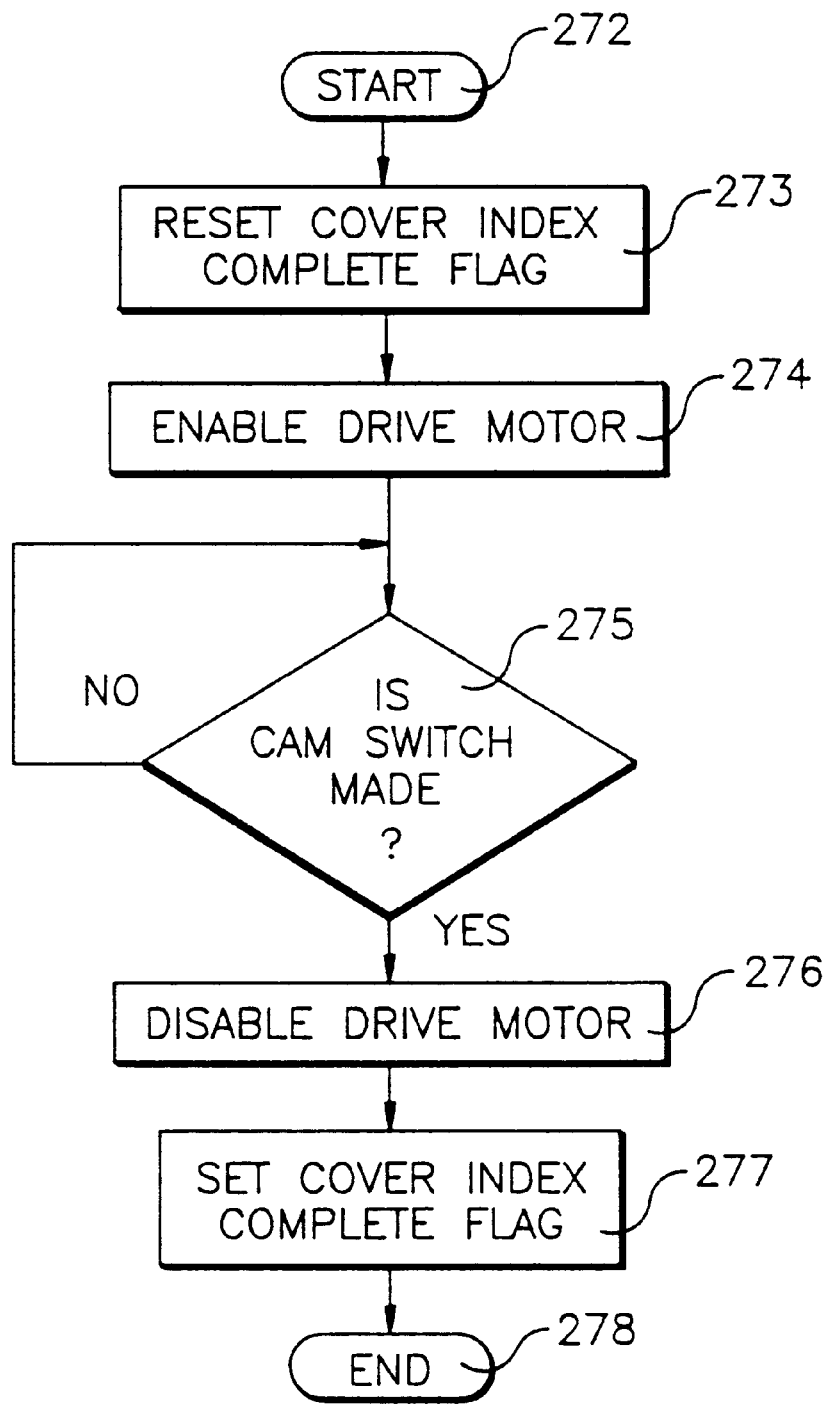
FIG. 33 is a flow diagram illustrating the cover tape indexing procedure.

Once the programmed number of printed layers has been tacked onto the stack, the stacking head or stage is then moved in the y-direction into the cover layer stacking position, aligned with cover tape 28 (step 172). The cylinders 87 are then extended to lift the stack into contact with the cover tape and to apply tacking pressure for a preset time as with the printed tape layers (step 173). The preset time may be different for the cover layers. Again, before the preset tacking time has expired, the cutter activating cylinders 89 are extended and retracted (step 174) to excise the cover tape layer. The cylinders 87 are all retracted after the preset tacking period has expired (175). The cover tape indexing sequence, illustrated in FIG. 33, is then activated (step 176) to index the cover tape a predetermined distance. In the next step, a check is made of whether the programmed number of cover layers has been tacked onto the stack (177). If not, a determination is made of whether the cover index sequence is complete (178), as determined by a cover index flag. Once cover index is complete, the program returns to the main path prior to step 173 to tack and excise the next cover layer in steps 173 to 176. Once the required number of cover layers is complete, a determination is made of whether more printed layers are needed (179). If more layers are required, the program returns (180) to point C in the printed tape stack and tack sequence.

If no more printed or cover layers are required, and the stack is complete, the x- and y-direction servo motors are actuated to move the stage back to the unload position aligned with the cassette 103 (step 181). Cylinders 87 are extended to raise the stack to the unload position (step 182) and the electromagnet 100 is de-energized (183). The stack and tack unload sequence is then started (step 184).

Figure 31A:
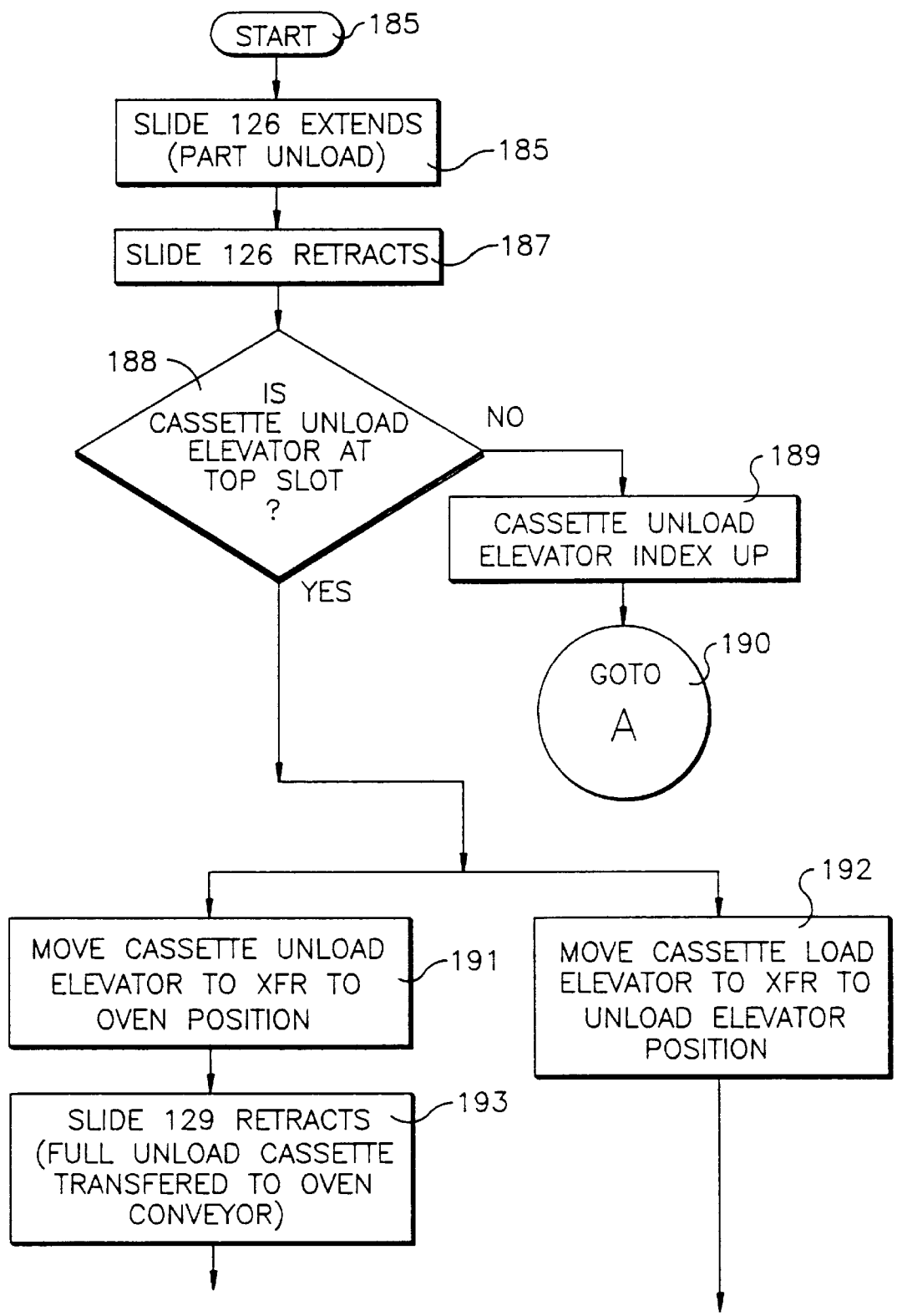
FIGS. 31A–C are flow diagrams illustrating the unloading sequence for unloading a completed stack from the stack and tack station.
Figure 31B:
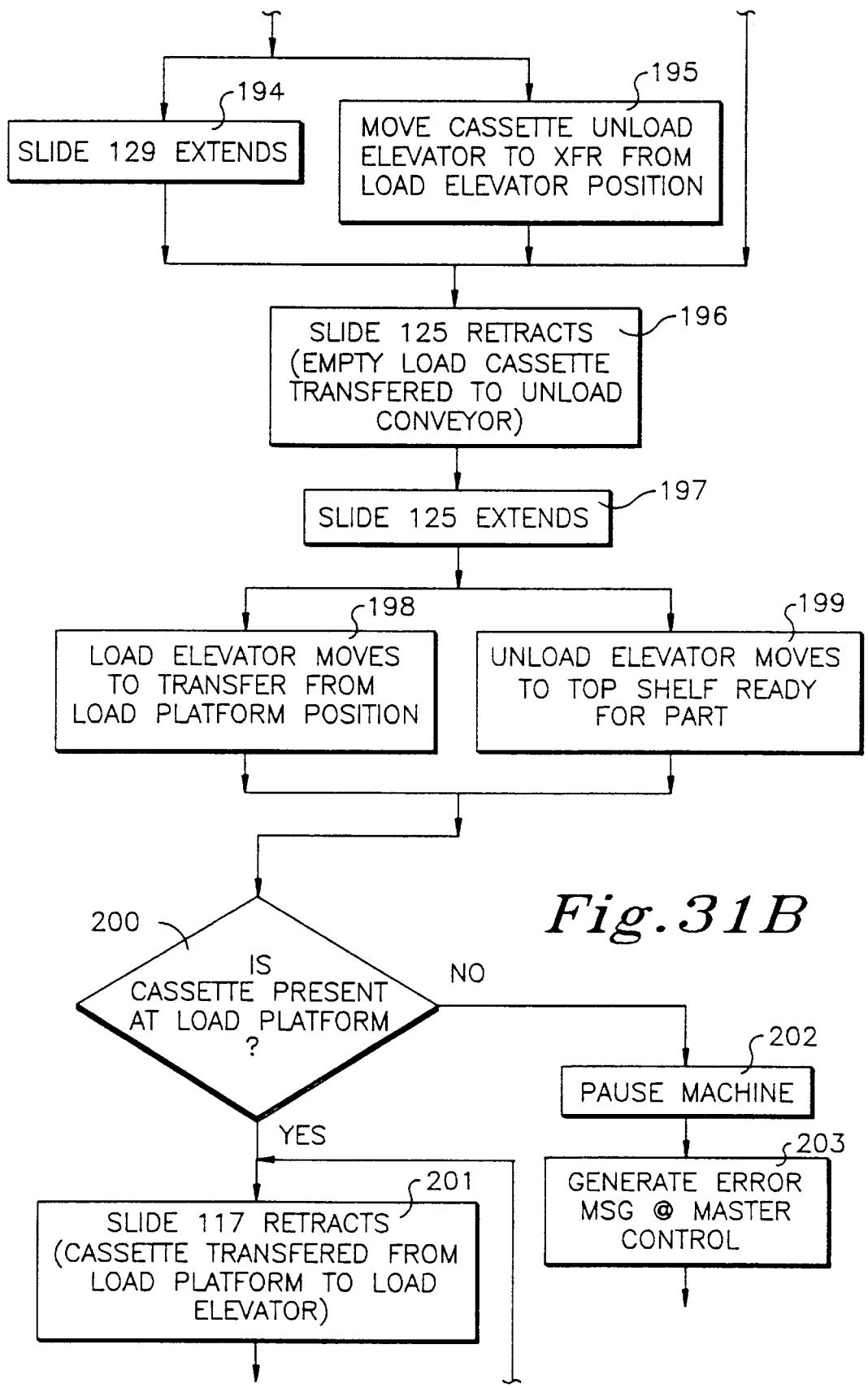
Figure 31C:
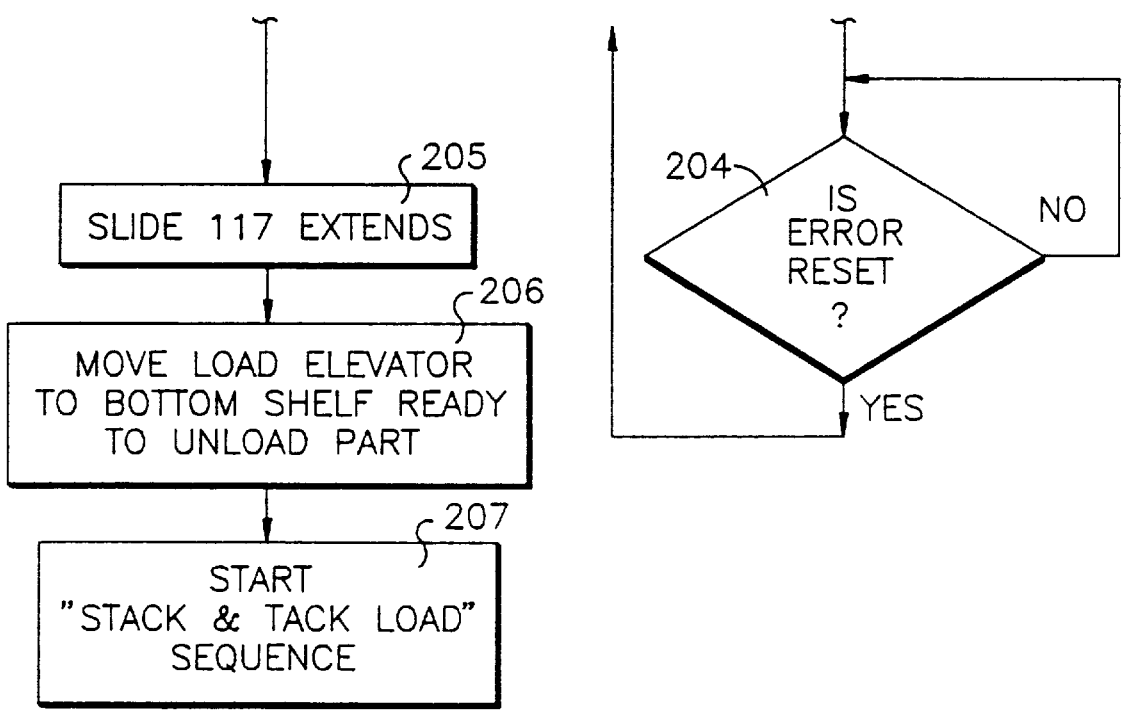

The stack and tack unload sequence is illustrated in FIGS. 31A–C. At the start of a stacking and tacking operation, the unload cassette will be completely empty and will be positioned at the lowermost position in elevator 106, with the top shelf aligned with the slide 126. When the unload sequence is initiated (185) the slide 126 is extended until a limit switch (not illustrated) indicates that slide 126 is fully extended (186). This acts to push the part off the stage and into the top shelf of the unload cassette. The slide is then retracted to its inoperative position, as determined by a retract switch (187). In the next step 188, a determination is made of whether the unload cassette elevator is at the top slot or shelf position, indicating that the unload cassette is fully loaded with parts. If not, the cassette load elevator is indexed up to align the next, empty shelf with the stage (189), and the program returns to point A in the stack and tack load sequence (step 190), illustrated in FIG. 31A. When it is determined in step 188 that the unload cassette is fully loaded, the cassette unload elevator is moved to a position for transferring to the oven (step 191). At the same time, the cassette load elevator is moved to a position for transferring the load cassette, which should now be empty, to the unload elevator position (192).

Slide 129 then retracts to its retracted position, as determined by a suitable limit switch, simultaneously transferring the fully loaded cassette to the oven conveyor (step 193). At this point, simultaneously, the slide 129 is extended (194) and the cassette unload elevator is moved back to a position for transfer from the load elevator position (195). Slide 125 then retracts until its retract switch is actuated, and this transfers the empty load cassette to the unload conveyor position (196). The slide 125 is then extended back into position ready for the next transfer (197). The load elevator is then transferred to the load platform position (198) and, at the same time, the unload elevator moves to position the empty cassette with its top shelf ready to receive the next stacked part (199). If a cassette containing metal build plates is present on the load platform (200), slide 117 is retracted until its retract switch is actuated, simultaneously transferring the new load cassette from the load platform to the load elevator (201). If no cassette is present on the load platform, a machine pause is initiated (202) and an error message is generated on the operator's control panel (203) and remains until the error is reset (204).

Once the new load cassette is positioned in the load elevator, slide 117 is extended until the extend switch is actuated and the slide is ready to load the next load cassette from the platform (205). The load elevator is moved to position the load cassette in a position for unloading the metal build plate from the lowest shelf of the cassette (206). At this point, the stack and tack load sequence of FIGS. 29A and B is initiated (207).

In any electronic part to be made by this machine, there will be a recipe defining the number and location of printed and blank or cover layers. Blank or cover layers will be provided at the top and bottom of the stack. To save time, the metal build plates are preferably prepared with one or more cover or blank layers to form the bottom of the stack, prior to loading into a load cassette. There will be a number of active portions in the stack, each separated from the next active portion by center portions of one or more cover layers. Starting from the bottom of the stack, the layers to be stacked on top of the pre-laid base cover layers will be as follows:

Active #1—predetermined number of printed layers
Center #1—predetermined number of cover layers
Active #2—predetermined number of printed layers
Center #2—predetermined number of cover layers and so on until the last active portion, followed by a predetermined number of blank layers to form the top cover of the stack. The operator sets the number of layers in each active and center portion, and in the top cover, and the program will then automatically form the stack as defined, according to the sequence illustrated in FIGS. 30A–D.

Other variables which may be set in the stack and tack sequence are the offset value. Any desired y-direction offset may be set for the even print layers, or alternatively a 180° rotation may be set for each even print layer. The other variables which may be set by the operation are the tack pressure and time, and the print and cover platen temperatures.

Figure 32:
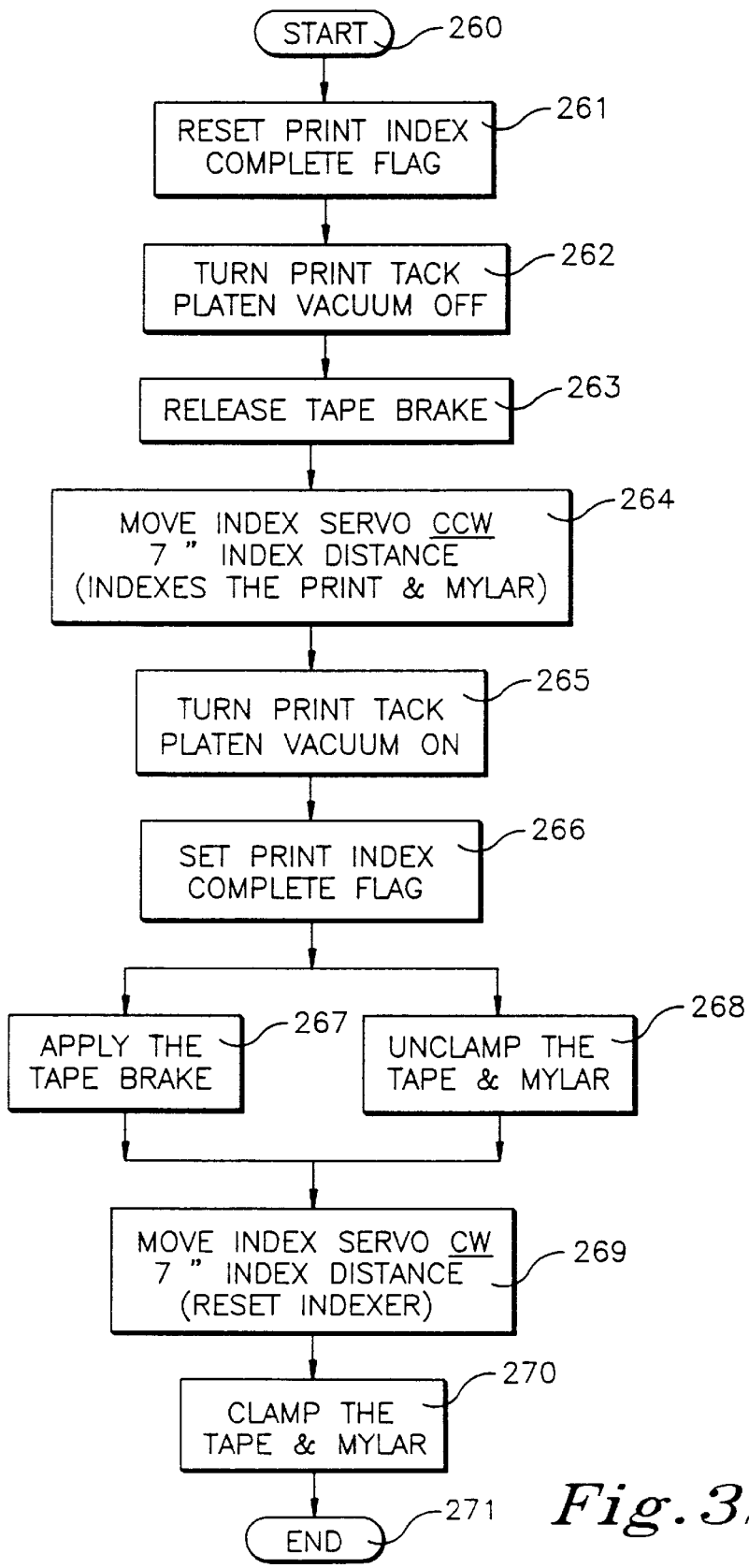
FIG. 32 is a flow diagram illustrating the print tape indexing procedure.

The print tape index sequence is illustrated in FIG. 32. At the start 260 of the sequence, the print index complete flag is reset (261). The print tack platen vacuum is turned off (262), releasing the tape at this position. A tape brake (not illustrated) is then released (263) and the tape is clamped via clamping frames 36,37. The tape index servo controller is then moved by a distance equal to the desired index distance, typically of the order of 7" (264). The print tack platen vacuum is then turned on again (265), adhering the next portion of the print tape to the platen. The print index complete flag is then set (266), allowing the stack and tack sequence of FIG. 30A–D to proceed (see step 154 of the stack and tack sequence). At this point, the tape brake is reapplied (267), and the cylinders 46 extend to release the tape clamp (268). The index servo controller is then moved back by an equivalent distance of 7", for example, to reset the tape indexer (269). Cylinders 46 then retract to re-clamp the tape (270), ready for the next tape indexing sequence, and the print index sequence ends (271). If a print frame has been tagged as bad at the print inspection station, the print index sequence will advance the tape by an amount sufficient to skip any bad frame and proceed to the next good frame on the tape.

The cover tape indexing sequence is illustrated in FIG. 33. The cover index sequence is started (272) at step 176 of the stack and tack sequence of FIG. 30A–D. Initially, the cover index complete flag is reset (step 273). The drive motor is then enabled (274) until a cam switch is made (275) indicating that a predetermined length of tape has been driven. The drive motor is then disabled (276), and the cover index complete flag is set (277). This allows the stack and tack sequence to continue. The cover indexing sequence then ends (278).

The automatic capacitor chip maker or apparatus described above incorporates all of the steps necessary to make multi-layer capacitor chips starting from a roll of ceramic tape up to diced ceramic chips prior to firing. By automating all of the steps in this process, operator errors are removed and yields can be increased. Additionally, the production rate can be significantly increased. The number of operators needed is reduced by up to 80% over previous techniques where each of the stations was a separate machine which had to be loaded and unloaded independently. The heart of the machine is the stack and tack station, which aligns a stack of previously applied layers with an overlying printed frame of tape. This permits better accuracy even when using extremely thin tape, since the tape is held against a heated platen and the stack is brought up into contact with the tape when the correct alignment is achieved. The automatic loading and unloading assembly allows successive build plates to be loaded onto the stacking head, stacked with the designated number of cover and printed layers, and unloaded for automatic transfer to the lamination station, without requiring an operator to load each plate individually into the machine as was necessary in previous arrangements. It can be appreciated that this can considerably increase production rates and yields.

Although a preferred embodiment of the present invention has been described above by way of example only, it will be understood by those skilled in the field that modifications may be made to the disclosed embodiment without departing from the scope of the invention, which is defined by the appended claims.

We claim:

1. An apparatus for making a laminated electrical or electronic device from tape coated on one side with a ceramic material, comprising:

an inspection station for inspecting the quality of printing at a series of indexed segments on a ceramic coated, continuous tape;

a stack and tack station at which sequential segments of the continuous tape are cut from the tape and stacked on top of each other to form a stack having a selected number of layers;

a lamination station in which the stacked layers are laminated together;

a cutting station at which the stack is cut into a plurality of individual chips;

a continuous tape feed mechanism for indexing the continuous tape sequentially through the inspection station and the stack and tack station such that successive segments of the tape are sequentially positioned at the stations a controller for controlling operation of the tape feed mechanism and stack and tack station;

the stack and tack station including a movably mounted stacking head movable back and forth between a load and unload position, and at least one stacking position in alignment with an indexed tape segment, and movable between a lowered position and a raised position in contact with an indexed tape segment: and the stacking head having a cutting device for excising a patterned or unpatterned substrate from the tape in the raised position of the stacking head and transferring the substrate to the stacking head, the tape feed mechanism advancing the next sequential tape segment to the stack and tack station after lowering of the stacking head back to the lowered position, whereby repetitive operation of the stacking head and cutting device causes a plurality of patterned or unpatterned substrates to be formed into a stack on the stacking head.

2. The apparatus as claimed in claim 1, wherein the stack and tack station further includes a support frame, a y-platform movably mounted on the support frame for movement in a y-direction, a y-direction actuator for moving the y-platform back and forth in the y-direction, an x-platform movably mounted on the y-platform for movement back and forth in an x-direction perpendicular to the y-direction, an x-actuator for driving the x-platform back and forth in the x-direction, a turntable rotatably mounted on the x-platform, a θ-actuator for rotating the turntable, and the stacking head being movably mounted on the turntable for movement in a z-direction perpendicular to the x- and y-directions.

3. The apparatus as claimed in claim 1, including a first tape supply for supplying a first ceramic tape, a series of tape guides for guiding the first ceramic tape in a predetermined first path through the inspection station and stack and tack station, the first tape path being positioned above the stacking head in the first stacking position, and a second tape supply for supplying a second, cover ceramic tape, and a series of tape guides for guiding the second, cover tape through the stack and tack station in a second tape path extending parallel and alongside the first tape path, and the stack and tack station including a second stacking position in which the stacking head is aligned beneath a segment of cover tape.

4. The apparatus as claimed in claim 1, including a load assembly for feeding an empty build plate onto the stacking head in the load and unload position and an unload assembly for unloading a build plate and accumulated stack from the stacking head after a desired number of layers has been built up onto the plate.

5. The apparatus as claimed in claim 4, wherein the load assembly comprises a vertical load elevator having a load platform and a first drive mechanism for driving the load platform up and down in the load elevator, and a plurality of cassettes each having a plurality of shelves for supporting a series of build plates on each of which a stack of layers of excised tape can be built, each shelf having an open front end for allowing build plates to be pushed off the shelf and onto the stacking head, the load platform having a mounting device for releasably holding a cassette on the load platform.

6. The apparatus as claimed in claim 5, wherein the load assembly comprises a vertical unload elevator positioned alongside the load elevator, the unload elevator having an unload platform, a second drive mechanism for driving the unload platform up and down in the unload elevator, the unload and load platforms being positioned in alignment in a first transfer position of each elevator, and a transfer mechanism for transferring an empty cassette in the load elevator into the unload elevator at the first transfer position, the unload platform having a mounting device for releasably holding a cassette on the unload platform.

7. The apparatus as claimed in claim 6, further including a first pusher assembly for pushing build plates one at a time from a cassette in the load elevator onto the stacking head, and a second pusher assembly for pushing a build plate onto which a predetermined stack of tape layers has been formed into a cassette on the unload platform.

8. The apparatus as claimed in claim 7, wherein the unload elevator has a second transfer position spaced vertically from the first transfer position, the cassette having an end shelf aligned with the stacking head in said second transfer position, and a drive mechanism including a transport assembly for transporting a cassette having a build plate carrying a completed stack on each shelf from the second transfer position in the unload elevator to the lamination station.

9. The apparatus as claimed in claim 8, including a third elevator adjacent the lamination station, the third elevator having a vertical elevator shaft, a third platform movably mounted in the elevator shaft and having a mounting device for releasably holding a cassette on the platform and a third drive mechanism linked to the platform for driving the third platform up and down the elevator shaft, the lamination station having a lamination cavity for receiving a build plate carrying a stack for lamination, and a lamination station load actuator for loading a build plate from a cassette shelf aligned with the lamination cavity from the cassette to the lamination cavity, and returning a build plate carrying a laminated stack from the lamination cavity to the same cassette shelf.

10. The apparatus as claimed in claim 9, wherein the third elevator has a first transfer position in which the platform is aligned with the transport assembly for receiving a full cassette from the transfer assembly onto the platform.

11. The apparatus as claimed in claim 10, including a further transport assembly for transferring a cassette full of laminated stacks from the third elevator to the cutting station, the cutting station having a cutting stage, a fourth elevator adjacent the cutting station having an outlet end aligned with the cutting stage, the fourth elevator having an elevator shaft, a fourth platform movably mounted in the fourth elevator shaft and having a mounting device for releasably holding a cassette on the platform, and a fourth drive mechanism for driving the fourth elevator up and down in the elevator shaft whereby each shelf of the cassette in turn is aligned with the outlet end of the shaft, and a cutting stage load actuator for transferring a laminated stack on a build plate supported on a shelf at the outlet end of the shaft onto the cutting stage, and returning the cut stack to the same shelf after cutting is complete.

12. The apparatus as claimed in claim 1, including first and second tape supplies, a first set of tape guides for guiding a first tape from the first tape supply in a first tape path through the inspection station and stack and tack station, a second set of tape guides for guiding a second tape from the second tape supply in a second tape path through the stack and tack station, the first and second tape paths extending side-by-side through the stack and tack station, the first tape having a series of printed frames, and the second tape comprising a cover tape, the stack and tack station including a movably mounted stacking head movable between at least two positions comprising a first position aligned beneath a segment of the first tape and a second position aligned beneath a segment of the second tape, a first drive means for driving the stacking head between the first and second positions, the stacking head being vertically movable between a lowered position and a raised position in which the head contacts the overlying tape segment, a second drive means for driving the stacking head between the lowered and raised positions, and the stacking head including cutter means for cutting a portion of the ceramic coating of the tape from the remainder of the tape segment when the head is in the raised position, and the controller including means for controlling the first and second drive means and cutter means to form a stack comprising a preprogrammed number of printed and unprinted layers in preprogrammed positions in the stack.

13. The apparatus as claimed in claim 1, wherein the controller includes means for receiving data from the inspection station on the quality of successive tape frames, means for tagging any frame having a quality below a predetermined value, and means for controlling the tape feed mechanism when a tagged frame reaches the stack and tack station to feed the tagged frame through the stack and tack station until the next untagged frame reaches the stack and tack station, whereby any tagged frames are not applied to a stack.

14. The apparatus as claimed in claim 1, wherein the stack and tack station comprises a support frame, at least one downwardly facing heated platen mounted on the support frame adjacent and facing the tape path through the stack and tack station, a first platform movably mounted on the frame for movement in a first direction between at least two positions, a stacking head movably mounted on the first platform for vertical movement relative to the platform, the first position of the platform comprising a load and unload position for loading and unloading of build plates before and after a stack is formed on each plate, and the second position comprising a stacking position in which the stacking head is located beneath the tape and heated platen, and a drive assembly for moving the stacking head to a raised position in which it contacts the tape and urges the tape against the heated platen so that the tape segment adheres to an underlying layer of a stack formed on a build plate on the stacking head.

15. The apparatus as claimed in claim 14, including a cutting device movably mounted in the stacking head for movement between an advanced position raised above the level of the stacking head and a lowered position recessed within the stacking head, and an actuator for moving the cutting device from the lowered position to the advanced position when the stacking head is in the raised position, whereby a rectangular layer of substrate is excised from the tape and applied to the stack.

16. The apparatus as claimed in claim 14, including a second, cover tape feed mechanism for indexing a second, cover tape through the stack and tack station in a path alongside the first tape, a second heated platen being secured to the frame in a position aligned with the cover tape, and the first platform being movable into a third position in which the stacking head contacts the cover tape in order to apply a predetermined number of cover layers to a stack.

17. The apparatus as claimed in claim 1, including a printing station prior to the inspection station for printing predetermined circuit patterns on a series of successive frames of the tape.

18. The apparatus as claimed in claim 1, including a drive mechanism for moving a stack from the stack and tack station through the lamination station and cutting station.

19. An apparatus for making a laminated electrical or electronic device from tape coated on one side with a ceramic material, comprising:

an inspection station for inspecting the quality of printing at a series of indexed segments on a ceramic coated, continuous tape;

a stack and tack station at which sequential segments of the continuous tape are cut from the tape and stacked on top of each other to form a stack having a selected number of layers;

a lamination station in which the stacked layers are laminated together;

a cutting station at which the stack is cut into a plurality of individual chips;

a tape feed mechanism for indexing the continuous trade sequentially through the inspection station and the stack and tack station such that successive segments of the continuous tape are sequentially aligned at the respective stations;

a controller for controlling operation of the tape feed mechanism and stack and tack station;

the stack and tack station further including a support frame, a y-platform movably mounted on the support frame for movement in a y-direction, a y-direction actuator for moving the y-platform back and forth in the y-direction, an x-platform movably mounted on the y-platform for movement back and forth in an x-direction perpendicular to the y-direction, an x-actuator for driving the x-platform back and forth in the x-direction, a turntable rotatable mounted on the x-platform, a θ-actuator for rotating the turntable, and the stacking head being movably mounted on the turntable for movement in a z-direction perpendicular to the x- and y-directions; and at least two upwardly directed cameras mounted in the stacking head facing an indexed tape segment in a stacking position in the stack and tack station, the output of said cameras being linked to said controller, and said controller comprising means for controlling said x-, y- and θ-actuators in response to the output of said cameras to align a stack of ceramic layers on the stacking head at a predetermined orientation and position with respect to the indexed tape segment for forming next layer to be applied to the stack.

* * * * *